United States Patent [19]

Oshima et al.

[11] Patent Number: 5,444,297
[45] Date of Patent: Aug. 22, 1995

[54] NOISE RESISTANT SEMICONDUCTOR POWER MODULE

[75] Inventors: Seiichi Oshima; Fumitaka Tametani; Jun Yamagata; Ken Takanashi, all of Fukuoka, Japan

[73] Assignee: Mitsubishi Denki Kabushiki Kaisha, Tokyo, Japan

[21] Appl. No.: 75,316

[22] Filed: Jun. 11, 1993

[30] Foreign Application Priority Data

Jun. 17, 1992 [JP] Japan .................................. 4-157988

[51] Int. Cl.6 ...................... H01L 23/12; H01L 23/52; H01L 25/065
[52] U.S. Cl. ................................. 257/691; 257/700; 257/724; 257/660
[58] Field of Search ............... 257/698, 700, 723, 724, 257/660, 691, 704, 728, 659, 690, 703; 361/748, 760, 772, 777, 783, 784, 796, 800

[56] References Cited

U.S. PATENT DOCUMENTS

| | | | |
|---|---|---|---|
| 4,965,710 | 10/1990 | Pelly et al. | 363/56 |
| 5,043,526 | 8/1991 | Nakagawa et al. | 174/250 |
| 5,077,595 | 12/1991 | Fukunaga | 357/40 |
| 5,241,456 | 8/1993 | Marcinkiewicz et al. | 257/700 |

FOREIGN PATENT DOCUMENTS

| | | |
|---|---|---|
| 0425841 | 5/1991 | European Pat. Off. |
| 2303414 | 10/1976 | France |
| 0008976 | 1/1979 | Japan ................ 257/700 |
| 0018340 | 1/1982 | Japan ................ 257/660 |
| 0086841 | 4/1987 | Japan ................ 257/659 |
| 0069258 | 3/1988 | Japan |
| 0218060 | 9/1991 | Japan |
| 0032258 | 2/1992 | Japan |
| 2134708 | 8/1984 | United Kingdom |

OTHER PUBLICATIONS

Patent Abstracts of Japan, vol. 14, No. 239, (E-930), May 21, 1990, J P Kokai #02-065240, Mar. 5, 1990.
Shinohe et al, "Isolation Structure Optimization for High Power Reverse Conducting GTO", 1988 IEEE PESC '88 Record, Apr. 1988 pp. 908-914.

*Primary Examiner*—Rolf Hille
*Assistant Examiner*—Peter Toby Brown
*Attorney, Agent, or Firm*—Oblon, Spivak, McClelland, Maier & Neustadt

[57] ABSTRACT

In a circuit board having four-layered conductive pattern on which a control circuit is arranged, wiring sub-patterns 133a in the first layer are divided into four areas A1–A3 and A8, for respective sets of circuit parts having same power potentials. Respective sub-patterns belonging to the areas A1–A3 are partially or fully surrounded by wiring sub-patterns PEa1 PEa3 connected to negative power potentials of circuit parts belonging to respective areas, respectively. Similarly, at least part of a wiring patten Pa2 for transmitting an input signal to a semiconductor active element is surrounded by a wiring pattern PEa4. Penetration of electric noises to the wiring patterns for the control circuit, in particular to the wiring pattern for transmitting the input signal to semiconductor element, is decreased to thereby prevent misoperation due to electric noises.

7 Claims, 20 Drawing Sheets

F I G. 13(A)
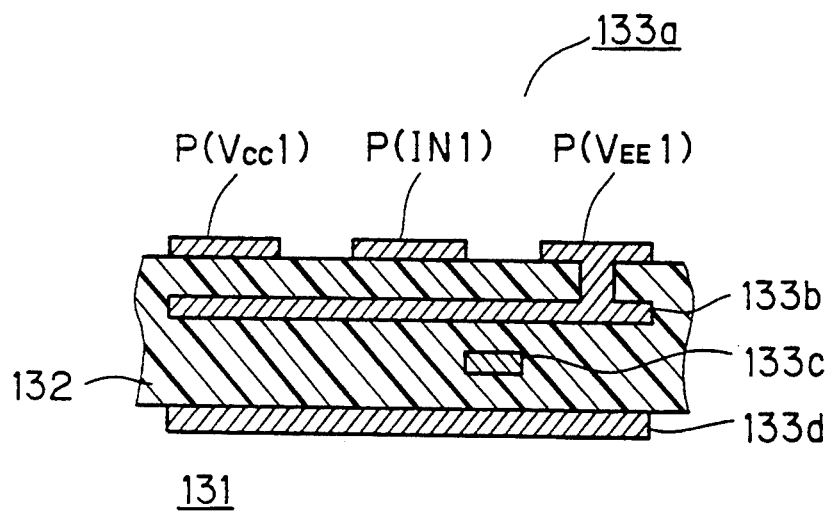
F I G. 13(B)
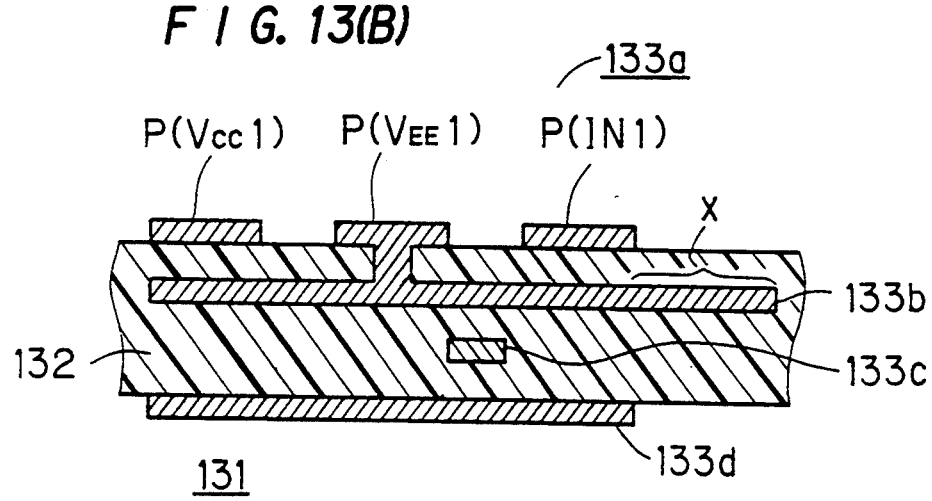

NOISE RESISTANT SEMICONDUCTOR POWER MODULE

BACKGROUND OF THE INVENTION

1. Field of the Invention

The present invention relates to an improvement for obtaining a semiconductor power module resistant to electric noises.

2. Description of Background Arts

In a semiconductor power module, a combination of a main circuit and a control circuit are provided in the form of a single device, in which the main circuit comprises a semiconductor clement for controlling electric power while the control circuit comprises another semiconductor element for controlling the operation of the main circuit. Such a semiconductor module is often utilized in an inverter for controlling motors, and the like. The semiconductor power module should be capable of switching a power at a high frequency to reduce the power loss and to ensure a quick response and an accuracy in the objective device to be controlled by the semiconductor power module, e.g, motors. Further, it is desired to obtain semiconductor power modules operable to control higher power and usable for driving large-size motors of industrial use. In response to this demand, new semiconductor power modules have been developed, in which an insulated gate bipolar transistor (which will be hereinafter referred to as "IGBT") capable of high-speed switching is used as a power control semiconductor device so that a voltage of about 220 V and a current of about 30 A are controlled at a frequency of about 10 kHz.

However, it is still required to obtain devices capable of controlling higher power at higher frequency. The following problems should be solved in order to obtain semiconductor power modules operable to control a voltage of about 440 V and a current of 30 A through 600 A at a frequency of 10 kHz through 20 kHz.

In general, electric noises increase in proportion to the operation frequency and the current to be controlled. The electric noises often cause operation errors in the semiconductor elements included in the control circuit. Accordingly, even if the design of the power semiconductor modules is changed such that power semiconductor elements of high-speed switching and large current capacity are mounted on circuit boards of large current capacity, it is impossible to prevent operation errors due to electric noises to obtain semiconductor power modules of higher frequency and larger current.

Also in lower power modules for an output voltage of 220 V and an output current of at most 30 A, for example, it has been desired to prevent operation errors due to electric noises to reduce the size of the modules.

SUMMARY OF THE INVENTION

According to the present invention, a semiconductor power module comprises: (a) a main circuit comprising a power control semiconductor element operable to control electric power; and (b) a control circuit for controlling the main circuit, comprising: (b-1) a circuit board having first and second wiring patterns provided in first and second planes defined at different levels in parallel to a major surface of the circuit board, respectively.

The first wiring pattern comprises: (b-1-1) a first sub-pattern for transmitting an input signal from the exterior of the module to the control circuit; and (b-1-2) second and third sub-patterns provided in both sides of the first sub-pattern with gaps therebetween, and holding first and second power potentials of the control circuit, respectively, the second power potential being lower than the first power potential.

The second wiring pattern is connected to either of the second and third sub-patterns and substantially faces to a region covering the first through third sub-patterns and the gaps in the first plane.

According to the present invention, it is prevented that electric noises reach the first sub-pattern for transmitting the input signal, to thereby suppress interference of the electric noises in the input signal of the control circuit. Thus, misoperation of the control circuit due to the electric noises is effectively prevented.

In an aspect of the present invention, a semiconductor power module comprises: (a) a main circuit comprising a power semiconductor element operable to control electric power; and (b) a control circuit for controlling the main circuit.

The main circuit comprises: (a-1) a circuit board having first and second wiring patterns provided in first and second planes defined at different levels in parallel to a major surface of the circuit board, respectively.

The first wiring pattern comprises: (a-1-1) a first sub-pattern for transmitting a first signal from the main circuit to the control circuit; (a-1-2) a second sub-pattern for transmitting a second signal from the control circuit to the main circuit; and (a-1-3) a third sub-pattern holding an electric potential which is one of power potentials for the control circuit and is also supplied to the main circuit.

The second wiring pattern in said second plane is connected to the third sub-pattern and substantially faces to a region covering the first through third sub-patterns and the gaps in said first plane.

Consequently, it is prevented that electric noises reach the sub-patterns for transmitting signals relating respective operations of the control circuit and the main circuit, to thereby suppress interference of the electric noises in the signals. Thus, misoperation of the control circuit and the main circuit due to the electric noises is prevented.

In another aspect of the present invention, a semiconductor power module comprises: (a) a main circuit comprising a power control semiconductor element operable to control electric power; and (b) a control circuit for controlling the main circuit.

The control circuit comprises: (b-1) a circuit board comprising a wiring pattern, wherein the wiring pattern comprises: (b-1-1) an arrangement of first sub-patterns; and (b-1-2) a second sub-pattern holding one of power potentials for the control circuit and at least partially surrounding the arrangement of the first sub-patterns.

Also in this module, electric noises hardly reach the sub-patterns, whereby misoperation of the control circuit due to the electric noises is prevented.

In further another aspect of the present invention, a semiconductor power module comprises: (a) a main circuit comprising a power control semiconductor element operable to control electric power; and (b) a control circuit for controlling the main circuit, comprising: (b-1) a circuit board having: (b-1-1) a wiring pattern; and (b-1-2) a semiconductor element connected to the wiring pattern for generating and transmitting a control signal to the power semiconductor element in response to an input signal.

The wiring pattern comprises: a first sub-pattern for transmitting the input signal to the semiconductor element; and a second sub-pattern holding one of power potentials for the control circuit and at least partially surrounding the first sub-pattern.

In a preferred embodiment of the present invention, a semiconductor power module comprises: (a) a main circuit comprising: (a-1) a first circuit board; and (a-2) a power control semiconductor element mounted on the first circuit board and operable to control electric power; and (b) a control circuit provided over the main circuit for controlling the main circuit.

The control circuit comprises: (b-1) a second circuit board facing the first circuit board; and (b-2) a semiconductor element mounted on the second circuit board for generating and transmitting a control signal to the power semiconductor element in response to an input signal.

The second circuit board comprises: (b-1-1) a first wiring pattern provided in the second circuit board on which the semiconductor element is mounted; (b-1-2) a second wiring pattern provided under the first wiring pattern to substantially cover the first wiring pattern and holding one of power potentials of the control circuit; (b-1-3) a third wiring pattern provided under the second wiring pattern and transmitting the input signal to the semiconductor element; and (b-1-4) a fourth wiring pattern provided under the third wiring pattern to substantially cover the first and third wiring patterns, and holding one of power potentials of the control circuit.

The first wiring pattern is covered with wiring patterns holding power potentials of the second and fourth layers to prevent penetration of electric noises into the wiring pattern in the first layer. The third wiring pattern for holding an input signal for a semiconductor element included in the control circuit is sandwiched by the wiring patterns holding power potentials in the second and fourth layers. Accordingly, it is prevented that electric noises reach the wiring pattern for transmitting the input signal. Thus, misoperation of the control circuit due to the electric noises is prevented.

In another preferred embodiment of the present invention, a semiconductor power module comprises: (a) a main circuit for controlling electric power in a plurality of phases, comprising: (a-1) a first circuit board; and (a-2) power control semiconductor elements which are paired for each one of the plurality of phases and mounted on the first circuit board; (b) a control circuit provided over the main circuit for controlling the main circuit, comprising: (b-1) a second circuit board facing to the first circuit board; and (b-2) semiconductor elements mounted on the second circuit board for generating and transmitting control signals to the power semiconductor elements.

The semiconductor elements are classified into a plurality of groups according to power potentials thereof. The groups of the semiconductor elements are located in areas defined on the second circuit board substantially facing to corresponding power semiconductor elements having the same power potentials as the groups of the semiconductor elements, respectively.

Since the first circuit board for arranging a main circuit thereon is substantially faced to the second circuit board for arranging a control circuit thereon, the semiconductor power module can be made compact.

Further, the power control semiconductor elements corresponding to the plurality of phases provided on the first circuit board are arranged near to associated semiconductor elements on the second circuit one of whose power potential is common to the corresponding power control semiconductor elements, respectively. Consequently, influence of electric noises generated in other power control semiconductor elements whose power potentials are different from the semiconductor element to the operation of the semiconductor element is decreased. Thus, misoperation of the control circuit due to the electric noises is prevented.

In still another preferred embodiment of the present invention, a semiconductor power module comprises: (a) a main circuit mounted on a first circuit board, for controlling electric power; (b) a control circuit provided over the main circuit for controlling the main circuit, and mounted on a second circuit board facing to the first circuit board; and (c) a housing for containing the main circuit and the control circuit.

The housing comprises: (c-1) a housing body containing the main circuit and the control circuit; and (c-2) a cover member provided at a top of the housing body and comprising: (c-2-1) insulating plate; and (c-2-2) an electrically-conductive sheet fixed to a bottom surface of the insulating plate and holding one of power potentials of the main circuit.

The electrically-conductive sheet is effective for shielding the control circuit from noises. Thus, the module according to the present invention is advantageous in preventing misoperation of the control circuit due to the electric noises.

In a still preferred embodiment of the present invention, a semiconductor power module comprises: (a) a main circuit for controlling electric power in a plurality of phases, comprising: (a-1) a first circuit board; and (a-2) power control semiconductor elements which are paired for each one of the plurality of phases and mounted on the first circuit board; (b) a control circuit provided over the main circuit for controlling the main circuit, comprising: (b-1) a second circuit board facing to the first circuit board; and (b-2) semiconductor elements mounted on the second circuit board for generating and transmitting control signals to the power control semiconductor elements; and (c) a housing for containing the main circuit and the control circuit.

The housing comprises: (c-1) a housing body containing the main circuit and the control circuit; and (c-2) a cover member provided at a top of the housing body and comprising: (c-2-1) insulating plate; and (c-2-2) electrically-conductive sheets fixed to a bottom surface of the insulating plate and insulated from each other.

The semiconductor elements are classified into a plurality of groups according to power potentials thereof. The electrically-conductive sheets are located in areas defined in the bottom surface of the insulating plate substantially facing to the groups of the semiconductor elements and are electrically connected to one of the power potentials of the groups of the semiconductor elements, respectively;

In the present module, the shielding of the control circuit from noises are attained for each group of control elements.

Accordingly, an object of the present invention is to obtain semiconductor power modules of a relatively small size operable to control large power at a high frequency and free from operation errors due to electric noises.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 13(a) and 13(b) are sectional views of the circuit board of the control circuit according to the preferred embodiment of the present invention;

DESCRIPTION OF PREFERRED EMBODIMENTS

<<1. First Preferred Embodiment>>
<Circuit Construction and Operation of Module 100>

Figure 2:
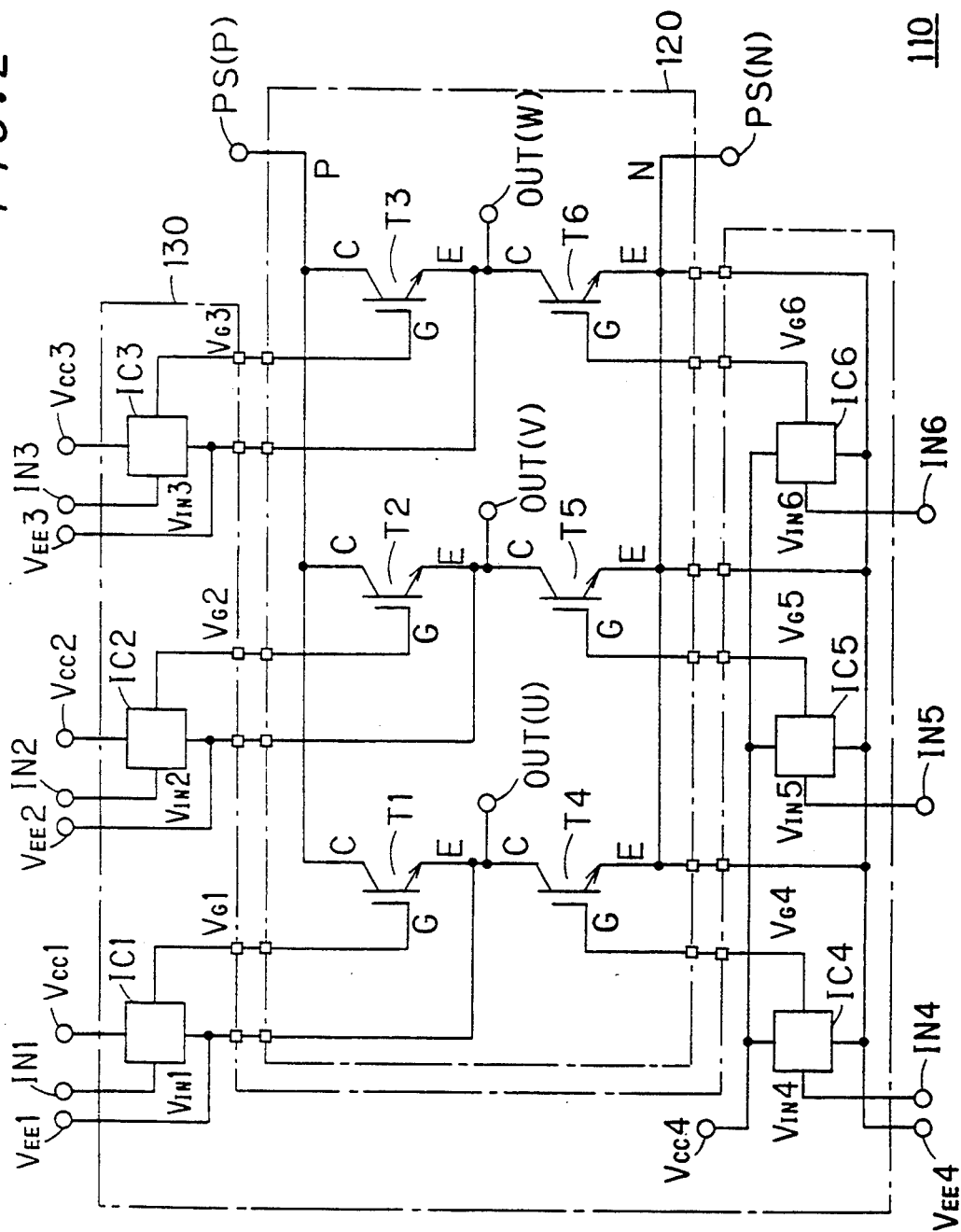
FIG. 2 is a circuit diagram of a semiconductor power module according to the preferred embodiment of the present invention.

FIG. 2 is a circuit diagram showing a major portion of a circuit 110 included in a semiconductor power module 100 according to a first preferred embodiment of the present invention. The rated output voltage of the module 100 is 440 V and the maximum output current of the module 100 is 30 A through 600 A, for example. The switching frequency for repeatedly turning-on and turning-off the output current is 10 kHz through 20 kHz.

The circuit 110 has two circuit parts 120 and 130. The main circuit 120 is a circuit part operable to control and output electric power. DC high potential P and low potential N are applied to power terminals PS (P and N) from an external power source (not shown), respectively. That is, electric power is supplied from the external power source to the main circuit 120 through the power terminals PS(P) and PS(N). The main circuit 120 comprises six IGBT elements T1–T6, which are operable to control the input power for each of three-phases U, V and W. The controlled three-phase power is outputted to an objective electric device provided out of the module 100 through three output terminals OUT(U), OUT(V) and OUT(W).

The control circuit 130 is a circuit part for controlling the IGBT (Insulated Gate Bipolar Transistor) elements T1–T6. The control circuit 130 comprises six semiconductor active elements IC1–IC6. The semiconductor elements IC1–IC6 generate gate voltage signals VG1–VG6 in response to input signals VIN1–VIN6, which are inputted through signal terminals IN1–IN6, and output the gate voltage signals VG1–VG6 to the gate electrodes G of the IGBT elements T1–T6, respectively. The IGBT elements T1–T6 open and close the current paths between collector electrodes C and emitter electrodes E.

Four individual DC external power sources are connected between power electrodes VCC1–VCC4 for a higher or positive potential and power electrodes VEE1–VEE4 for a lower or negative potential, respectively, whereby DC voltages are applied to the semiconductor elements IC1–IC6 through these power terminals. The negative power terminals VEE1–VEE3 are connected to the emitters E of the IGBT elements T1–T3, while the other negative power terminal VEE4 is connected to the emitters E of the other IGBT elements T4–T6 which have the same electric potential.

The main circuit 120 is so designed as to be resistive to large currents and heat generated by the currents, since relatively-large currents flow thorough the main circuit 120. On the other hand, relatively-small currents flow in the control circuit 130 since the circuit 130 is provided only for controlling voltage signals. Accordingly, it is not necessary to design the control circuit 120 as a circuit resistive to large current.

<Outside View of Module 100>

Figure 3:
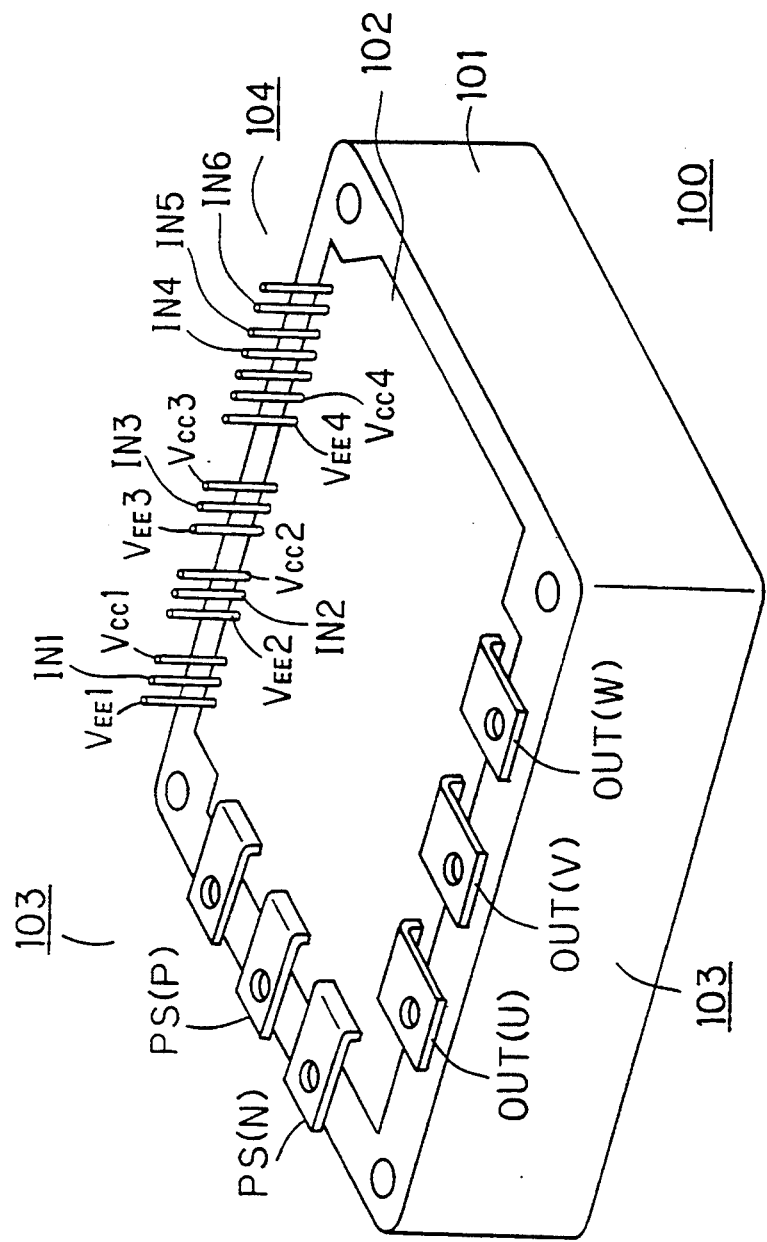
FIG. 3 is a perspective outside view of the semiconductor power module according to the preferred embodiment of the present invention.

FIG. 3 is a perspective view depicting the outside of the module 100. The module 100 comprises a housing 101 made of an insulator such as a synthetic resin. A cover 102 is provided at the top of the housing 101. The terminals 103 of the main circuit 110 and the terminals 104 of the control circuit 120 are projected out of the housing 101.

<Arrangement of Elements in Main Circuit 120>

Figure 4:
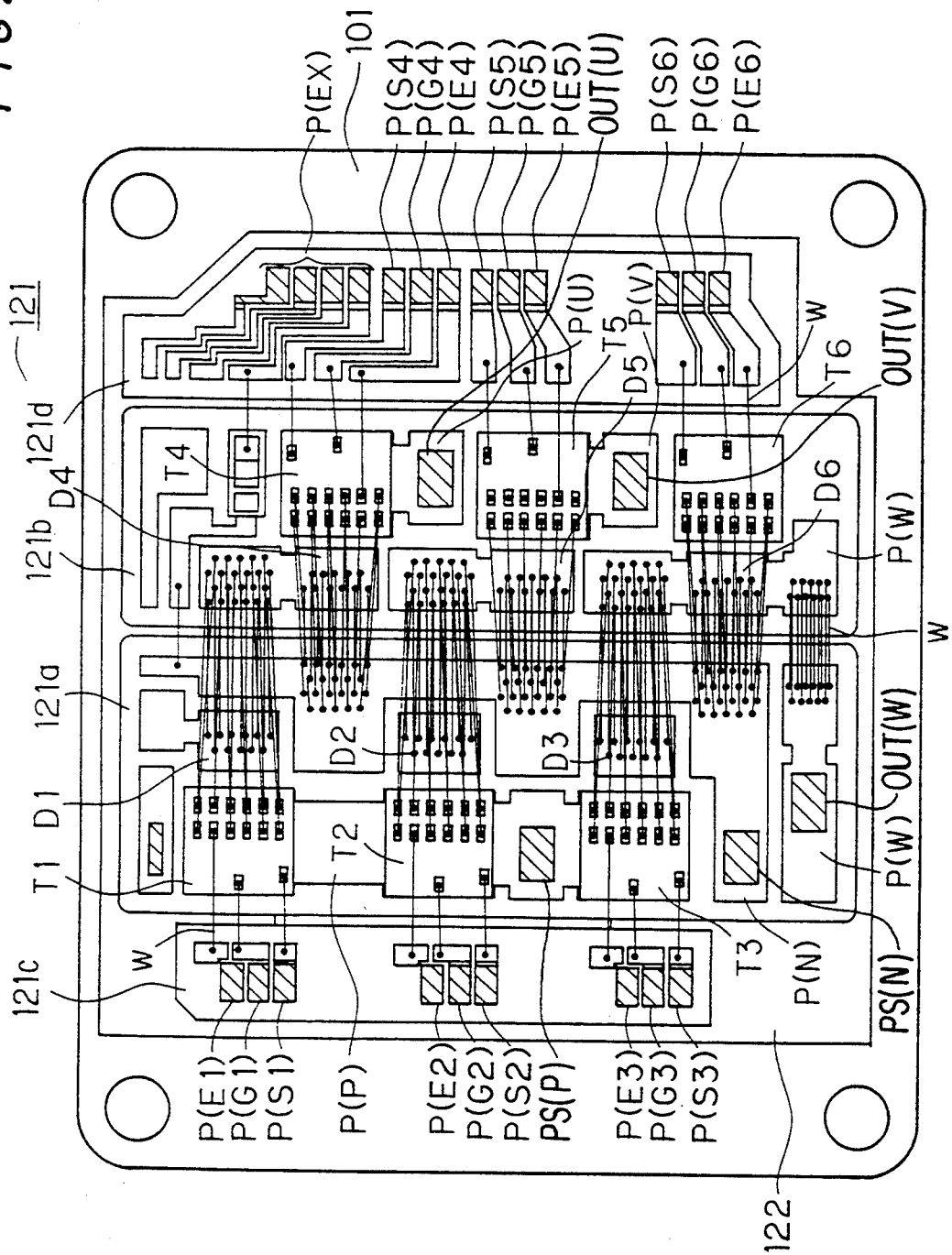
FIG. 4 is a plan view of a main circuit included in the semiconductor power module according to the preferred embodiment of the present invention.

FIG. 4 is a plan view of circuit boards 121 for the main circuit 120 mounted in a predetermined location of the housing 101. The circuit boards 121 comprise four circuit boards 121a–121d. The circuit boards 121a–121d are arranged on the top surface of a copper base 122 serving as the bottom plane of the housing 101. The IGBT elements T1–T6 with their associated passive circuit elements D1–D6 and wiring patterns are provided on the circuit boards 121a and 121b. The wiring patterns P(P), P(N), P(U), P(V) and P(W) are those for the higher potential P, the lower potential N, the U-phase output, the V-phase output and the W-phase output, respectively. These wiring patterns have sufficient widths for large current to flow therethrough. Respective wiring patterns are connected to corresponding power electrodes PS(P), PS(N), OUT(U), OUT(V) and OUT(W) on the parts depicted with hatching lines, respectively.

The circuit boards 121c and 121d are those for inter-connecting the IGBT elements T1–T6 to the control circuits 130. Among wiring patterns provided on the circuit boards 121c and 121d, the wiring patterns P(G1)–P(G6) are connected to the gate electrodes G of the IGBT elements T1–T6. Each of the IGBT elements T1–T6 comprises a detector circuit therein for detecting the collector current flowing in the collector electrode C and for outputting a voltage signal corresponding to the collector current detected. The wiring patterns P(S1)–P(S6) are connected to respective detector circuits included in the IGBT elements T1–T6 to transmit the detected signals representing the collector currents. The wiring patterns P(EX) are those for transmitting other signals.

On the portions depicted with hatching lines, these wiring patterns are connected to one end of a corresponding one of conductive pins PI (FIG. 6) which are connected to the control circuit 130. That is, these wiring patterns are connected to the control circuit 130 through the conductive pins PI. Many wires w are provided to inter-connect respective elements and to connect the elements to the corresponding wiring patterns.

<Arrangement of Elements in Control Circuit 130>

Figure 5:
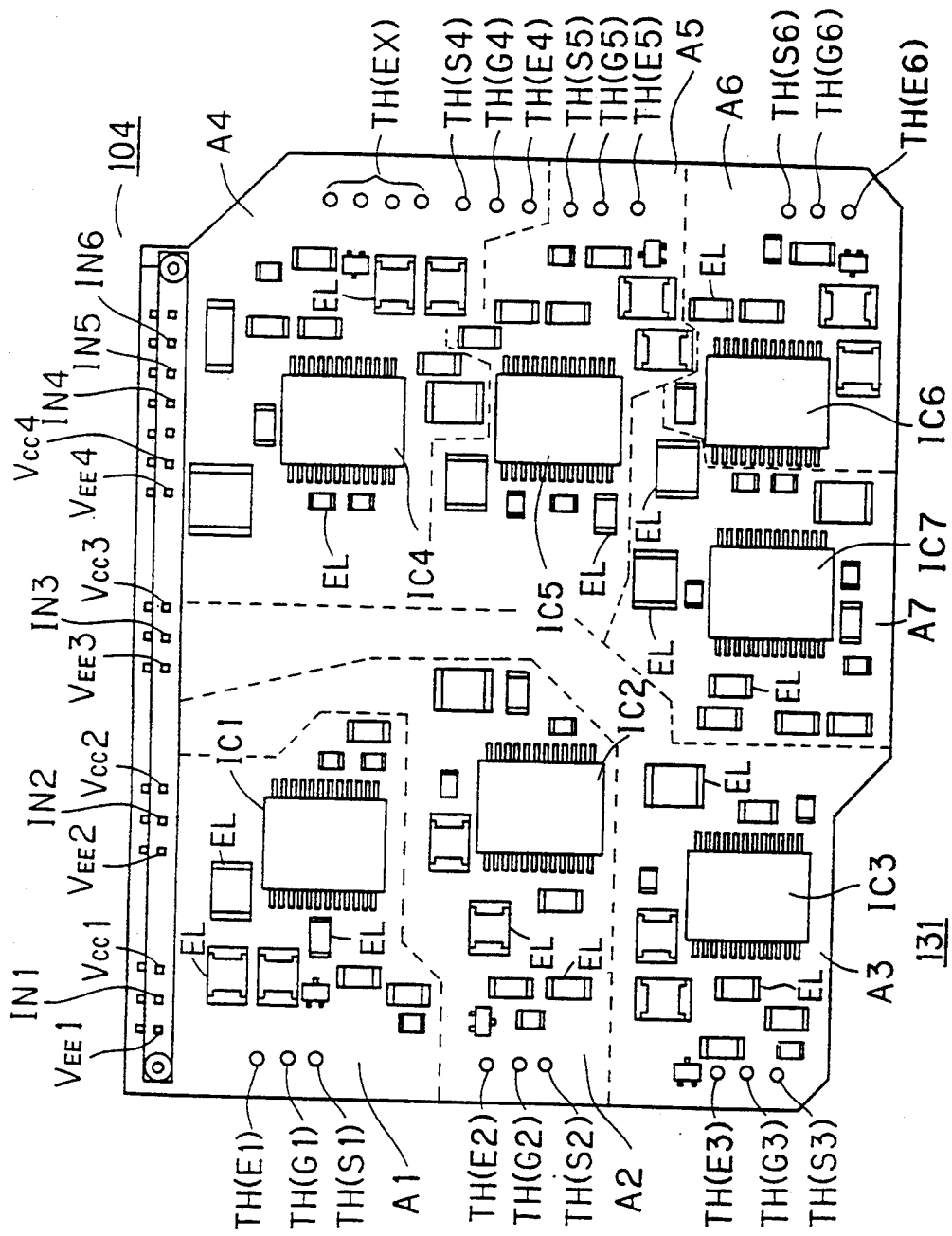
FIG. 5 is a plan view of a control circuit included in the semiconductor power module according to the preferred embodiment of the present invention.

FIG. 5 is a plan view of a circuit board 131 for the control circuit 130. Since the module is used for large currents, the control circuit 130 is arranged on the board 131 which is separated from the boards 121 on which the main circuit 120 generating a large amount of heat is arranged. Provided on the circuit board 131 are the semiconductor active elements IC1–IC7, their associated various passive elements EL and wiring patterns. Respective passive elements EL are arranged near to the associated ones of the semiconductor elements T1–T7 to prevent the semiconductor elements T1–T7 from misoperating due to electric noises. That is, the top major surface of the circuit board 131 is conceptually divided into a plurality of separated areas A1–A7 by imaginary boundaries shown with broken lines in FIG. 5, and corresponding one of the semiconductor elements IC1–IC7 and their associated circuit elements EL are provided in respective divided areas A1–A7 assigned thereto. The object of providing the semiconductor element IC7 is different from the other semiconductor elements IC1–IC6.

Through holes TH(E1)–TH(E6), TH(G1)–TH(G6), TH(S1)–TH(S6) and TH(EX) are formed in the circuit board 131 and are connected to the wiring patterns. Another end of each conductive pin PI (FIG. 6) is connected to the corresponding through hole. Accordingly, the through holes TH(E1)–TH(E6), TH(G1)–TH(G6), TH(S1)–TH(S6) and TH(EX) are connected to the wiring patterns P(E1)–P(E6), P(G1)–P(G6) P(S1)–P(S6) and P(EX) through the pins PI. Terminals 104 connected to the wiring patterns are installed on the circuit board 131, which terminals 104 are also connected to the external power sources mentioned above.

Figure 6:
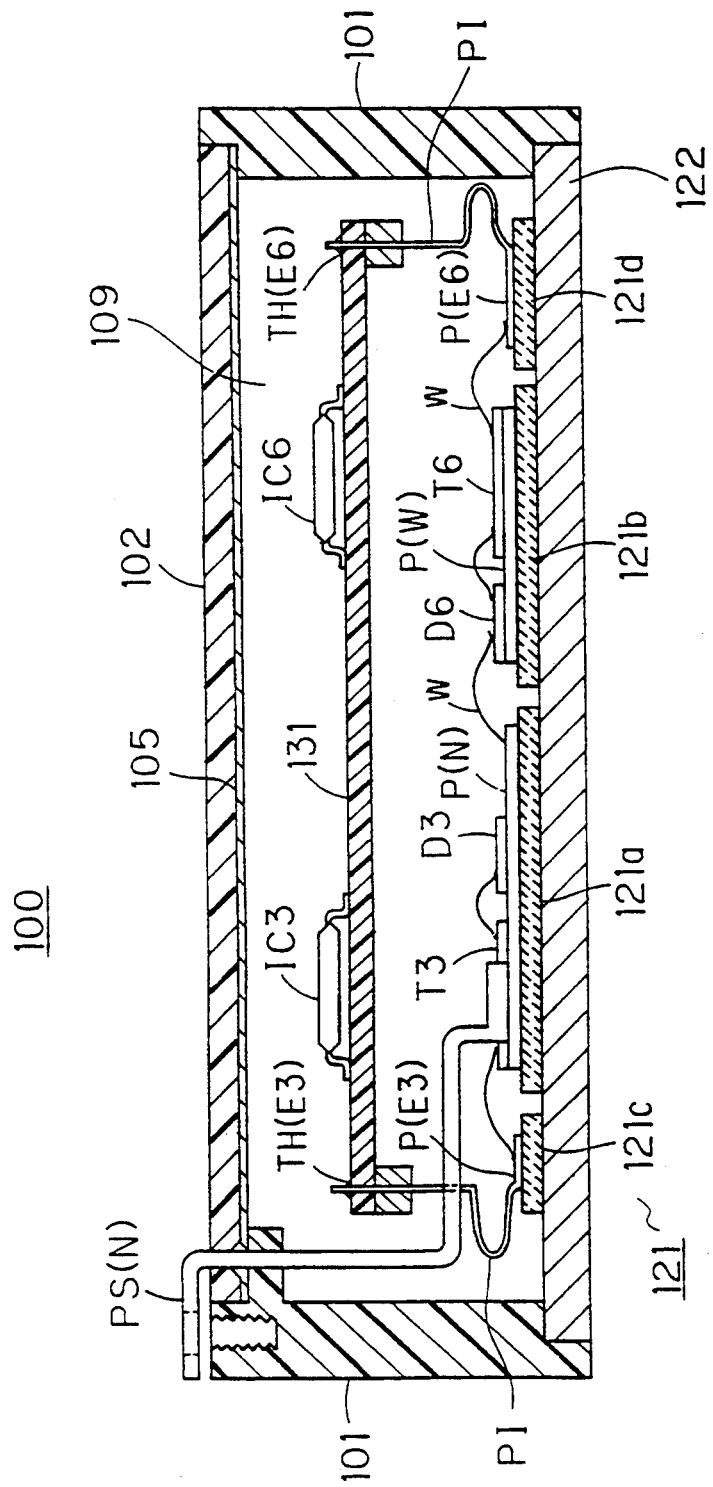
FIG. 6 is a front sectional view of the semiconductor power module according to the preferred embodiment of the present invention.

The circuit elements on the circuit boards 121 and on the circuit board 131 are arranged such that each of the semiconductor elements IC1–IC6 and its associated elements EL are located just or nearly over corresponding one of the IGBT elements T1–T6 and its associated element D1–D6 when the boards 121 and 131 are mounted in the module 100 as shown in FIG. 6. For example, the area A1 of the circuit board 131 on which the semiconductor element IC1 and its associated elements EL are located just or nearly over the area of the circuit boards 121 on which the IGBT element T1 and its associated element D1 are provided. Effectively prevented by such configuration is misoperation of the semiconductor elements IC1–IC6 due to electric noises generated in the elements provided on the circuit boards 121, the reason of which is as follows:

When the IGBT elements T1–T6 operate to turn-on and -off large collector currents, electric noises are generated in the IGBT elements T1–T6 and dissipate toward the semiconductor elements IC1–IC6. However, the negative power potential of the semiconductor element IC1, for example, is common to the IGBT element T1, so that the influence of the noises from the IGBT element T1 on the operation of the semiconductor element IC1 is not so much. On the other hand, the operation of the semiconductor element IC1 is sensitive to the noises from the other IGBT elements T2–T6. Thus, in the present module, the area A1 for the semiconductor element IC1 and its associated elements EL is located: over the IGBT element T1 to be controlled by these control elements; and relatively far from the other IGBT elements T2–T6. Consequently, the noises from the IGBT element T1 hardly influence all of the corresponding control element IC1 and the other control elements IC2–IC6. The other IGBT elements are also arranged in a similar manner, so that influences of noises on the control elements IC1–IC6 are effectively prevented. In the illustrated example, the respective negative power potentials for the IGBT elements IC4–IC6 together with. IC7 are common to the emitter potential of the IGBT elements IC4–IC6. Accordingly, the areas A4–A7 of the circuit board 131 may be located over the area of the boards 121 encompassing all of the IGBT elements T4–T6.

<Sectional Structure of Module 100>

FIG. 6 is a front sectional view of the module 100. The circuit board 131 is supported over the circuit boards 121 in the module 100 to make the size of the module 100 small. The respective circuits on the boards 121 and 131 are electrically connected to each other through the conductive pins PI. The circuit boards 121 are made of ceramic or aluminum nitride and respective bottom surfaces thereof are fully covered with copper films. The copper films are soldered onto the top surface of the copper base 122, whereby the circuit boards 121 are fixed to the copper base 122. The wiring patterns P(N), P(W) etc. are formed on the top surfaces of the circuit boards 121 and circuit elements including the IGBT elements T3, T6 etc. are soldered to the wiring patterns.

The copper base 122 substantially defines the bottom of the module 100 and is effective for dissipating heat generated in the module 100. That is, the heat generated by operation of the main circuit 120 is dissipated through the copper base 122 to thereby prevent excessive increase of the temperatures of the main circuit 120 and the control circuit 130.

The body of the cover 102 is made of electric insulator such as synthetic resin and a copper sheet 105 is adhered to almost all of the area of the bottom surface of the body. The copper sheet 105 is electrically connected to the power terminal PS(N) but is electrically insulated from the other terminals 103 and 104. That is, the electric potential of the copper sheet 105 is equalized to the lower potential N which is the stable reference potential of the module 100. Accordingly, the copper sheet 105 is effective for shielding external electromagnetic noises. The copper sheet 105 suppresses penetration of external electromagnetic noises into the module 100 to prevent misoperation of the control circuit 130 etc., and at the same time, suppresses radiation of electromagnetic noises from the main circuit 120 etc. to the exterior of the module 100. When the module 100 is actually used, external devices including the external power sources connected to the module 100 are provided near to the module 100. Preferably, the external devices are placed on the module 100. Since the heat-dissipation structure for dissipating the heat generated by relatively large power loss in the main circuit 120 is provided in the bottom of the module 100, as described above, the external devices are prevented from being exposed to the heat. In order to electrically connect the external devices to the module 100, the terminals 103 and 104 are provided on the top surface of the module 100. The external devices often generate strong noises, and if the module 100 is exposed to the strong noises, there is a possibility of the module 100 misoperating. On the other hand, the cover 102 according to the preferred embodiment of the present invention is provided with copper sheet 105. The strong electromagnetic noises from the external devices are shielded by the copper film 105 to prevent penetration of the noises into the control circuit 130.

Figure 7:
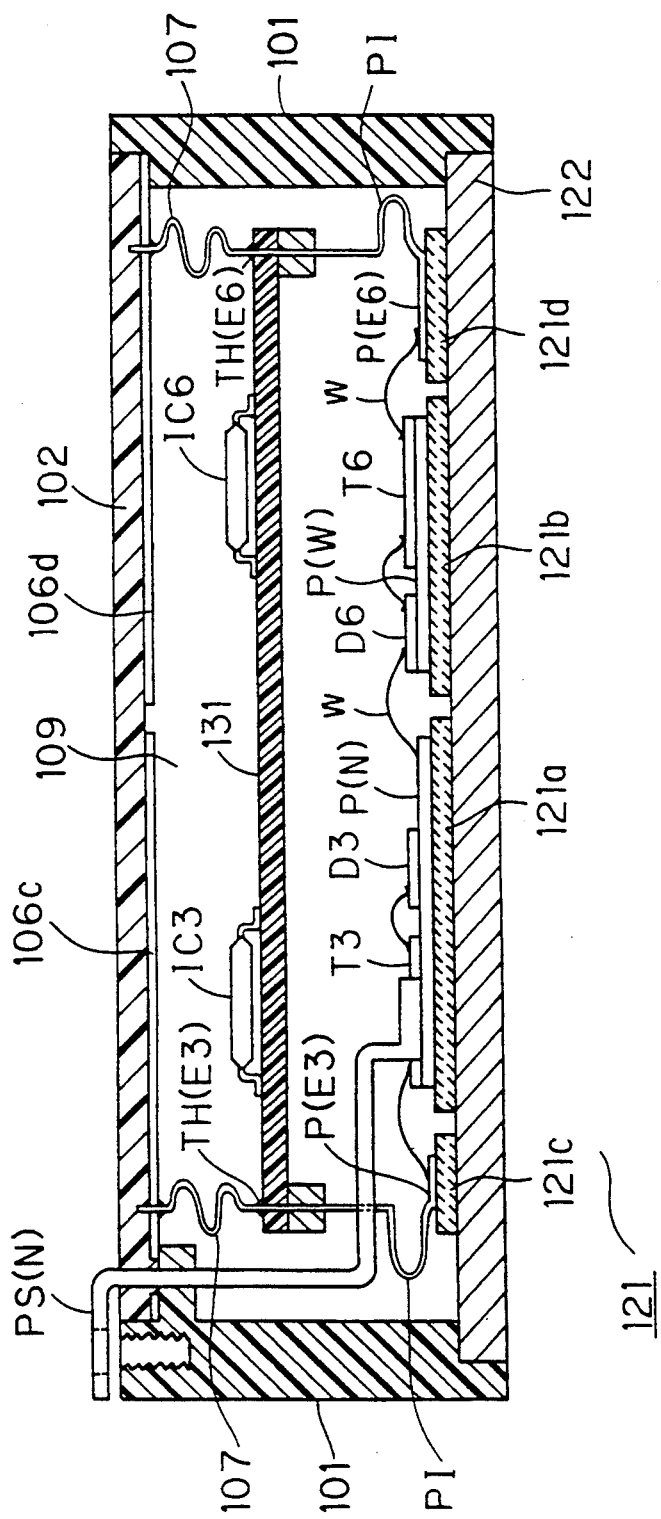
FIG. 7 is a front sectional view of a semiconductor power module according to a modification of the present invention.
Figure 8:
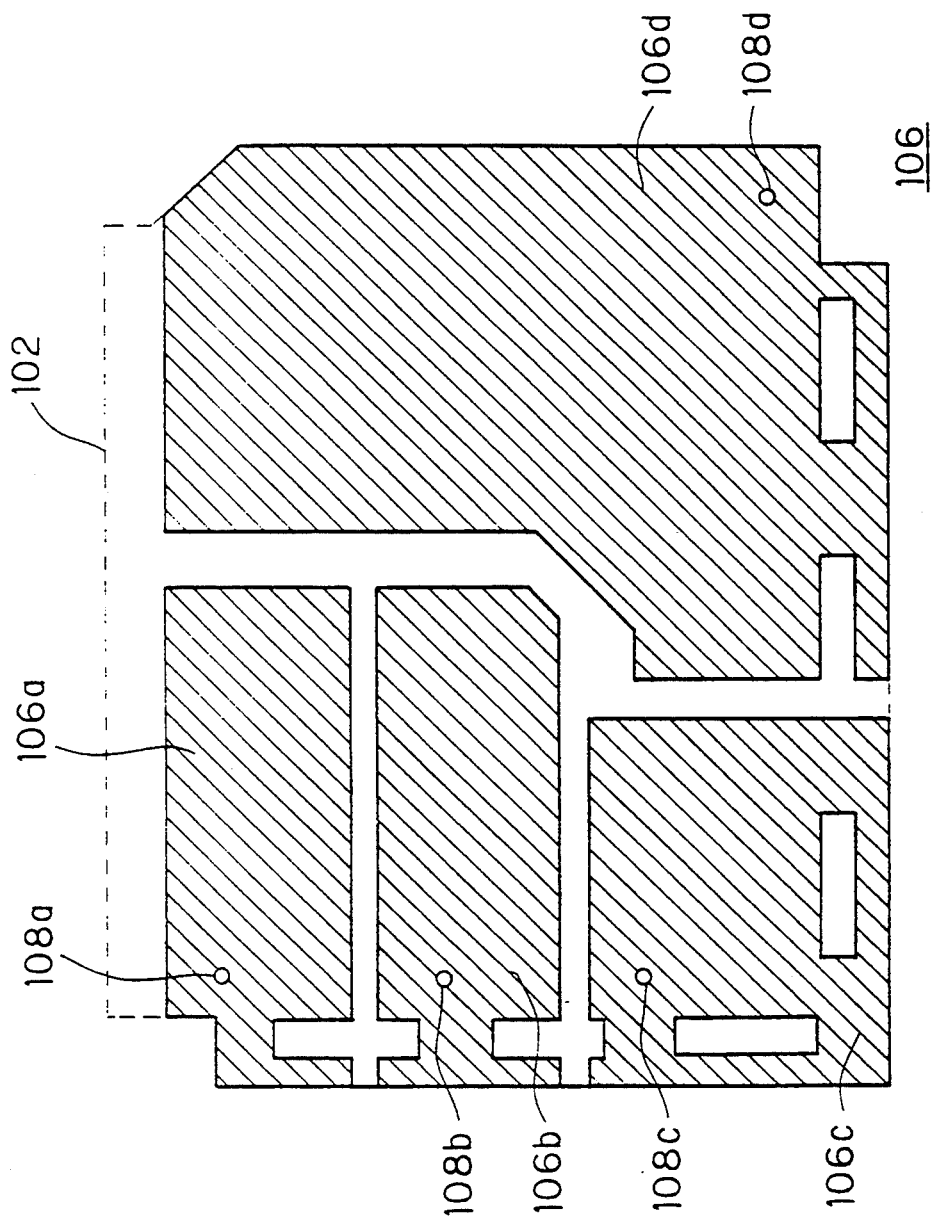
FIG. 8 is a plan view of a copper sheet in the modification of the present invention.

FIGS. 7 and 8 illustrate mother example for shielding electromagnetic noises. FIG. 7 is a front sectional view of the module 100 including the shielding structure, while FIG. 8 is a plan view of a copper sheet 106 in the shielding structure. As depicted in FIG. 8 by hatching, the copper sheet is divided into a plurality of partial copper sheets 106a–106d. The partial copper sheets 106a–106c are separated and arranged so as to cover the spaces over the areas A1–A3 of the circuit board 131, respectively. The power potentials of the semiconductor elements IC4–IC7 are equal to each other, and the areas A4–A7 are covered by a single partial copper sheet 106d. The partial copper sheets 106a–106d are connected through conductive wires 107 to the emitter potentials of the IGBT elements T1–T4, respectively, which are the negative power potentials of the corresponding areas of the circuit board 131. The conductive wires 107 are inserted into and soldered to holes 108a–108d formed in the partial copper sheets 108a–108d, whereby the wires 107 are electrically connected to the partial copper sheets 106a–106d. The copper sheet 106 is effective for shielding electromagnetic noises, as is the copper sheet 105 in FIG. 6.

The partial copper sheets 106a–106d are provided with rectangular notches or holes to electrically isolate the sheets 106a–106d from the terminals 103. In both of the structures in FIGS. 6 and 7, the internal space 109 of the housing 101 is filled by and sealed with synthetic resin or the like to protect respective electronic elements including the IGBT elements T1–T6.

<Wiring Pattern on Circuit Board 130>

Figure 9:
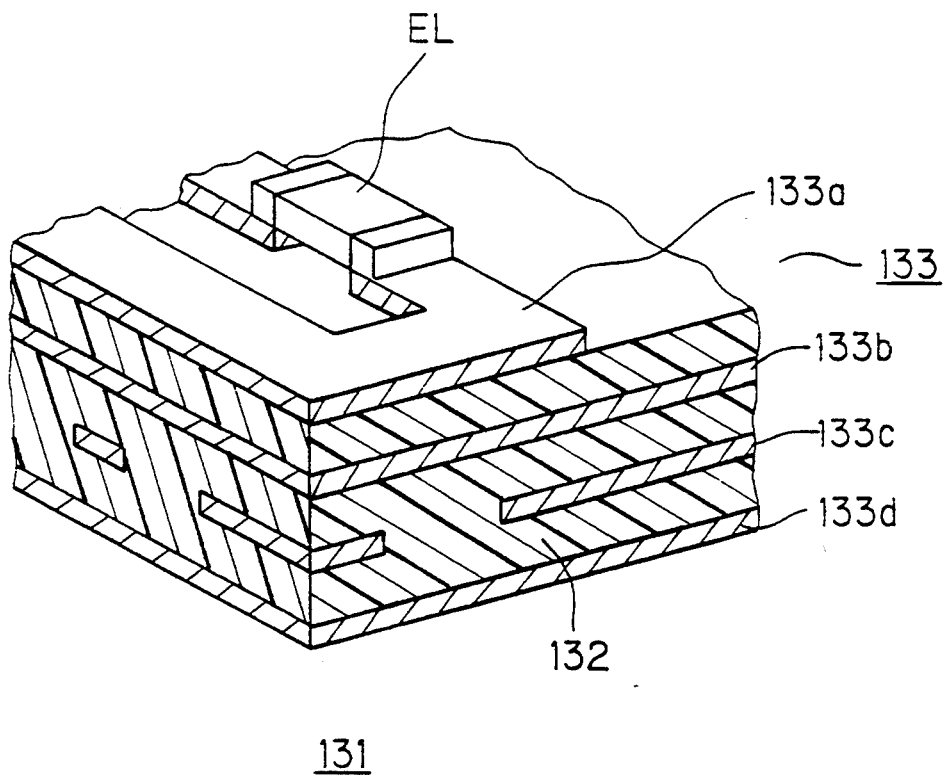
FIG. 9 is a partial cut-off view of a circuit board of the control circuit according to the preferred embodiment of the present invention.

FIG. 9 is a partial cut-off view showing the sectional structure of the circuit board 131. The circuit board 131 comprises a body plate 132 made of an insulator such as a synthetic resin, which is provided with four copper wiring layers 133. That is, the circuit board 131 has four-layered conductive patterns. FIGS. 1 and 10–12 are plan views showing the first to fourth wiring layers 133a–133d, respectively, which are arranged from the top to the bottom of the board 131. In FIGS. 1 and 10–12, the outline or contour of the body plate 132 is illustrated by broken lines.

As understood from FIGS. 1 and 10–12, respective wiring patterns for interconnecting the semiconductor elements IC1–IC3 and their associated elements EL are arranged so as to locate substantially within corresponding ones of the areas A1–A3 in which the elements to be connected by the wiring patterns are located, respectively. On the other hand, the wiring patterns for interconnecting the semiconductor elements IC4–IC7 and their associated elements EL are arranged so as to locate substantially within an area A8 fully covering the areas A1–A7 in which these elements are located. In the wiring pattern 133a, the wiring sub-patterns:

P(VEE1)–P(VEE4), P(VCC1)–P(VCC4) and P(IN1)–P(IN6)

are connected to:

VEE1–VEE4, VCC1–VCC4, and IN1–IN6 respectively.

Figure 1:
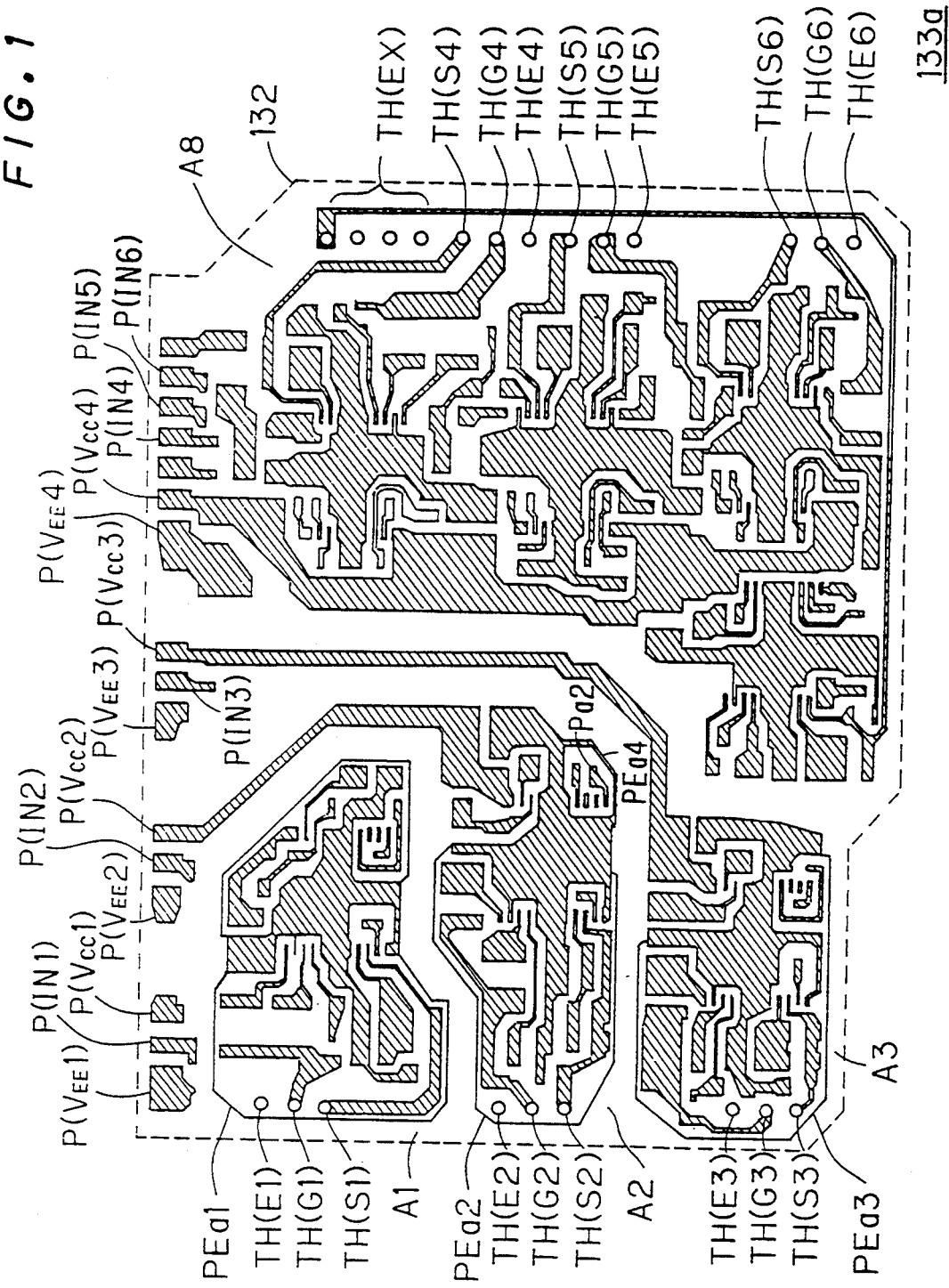
FIG. 1 is a plan, view showing a first wiring pattern layer of circuit board for a control circuit according to a preferred embodiment of the present invention.

As shown in FIG. 1, the wiring pattern 133a comprises wiring sub-patterns PEa1–PEa3 surrounding the respective sub-patterns in the areas A1–A3, respectively. The wiring sub-patterns PEa1–PEa3 are connected to the sub-patterns P(VEE1)–P(VEE2), respectively. Accordingly, the potentials of the wiring sub-patterns PEa1–PEa3 are maintained at the negative power potentials which are the stable reference potentials of the electronic elements in the areas A1–A3, respectively. The wiring pattern 133a further comprises a wiring sub-pattern PEa4 surrounding the sub-pattern Pa2 which transmits one of the input signals of the semiconductor clement IC2 belonging to the area A2. The wiring sub-pattern PEa4 is maintained at the negative power potential of the electronic elements belonging to, the area A2, similarly to the wiring sub-pattern PEa2.

Since respective wiring sub-patterns in the areas A1–A3 are surrounded by the wiring sub-patterns PEa1–PEa3 having the stable reference potentials, electric noises generated in the circuits located on neighboring areas hardly penetrate into respective circuits to thereby prevent interference of the noises in the input signals.

Figure 10:
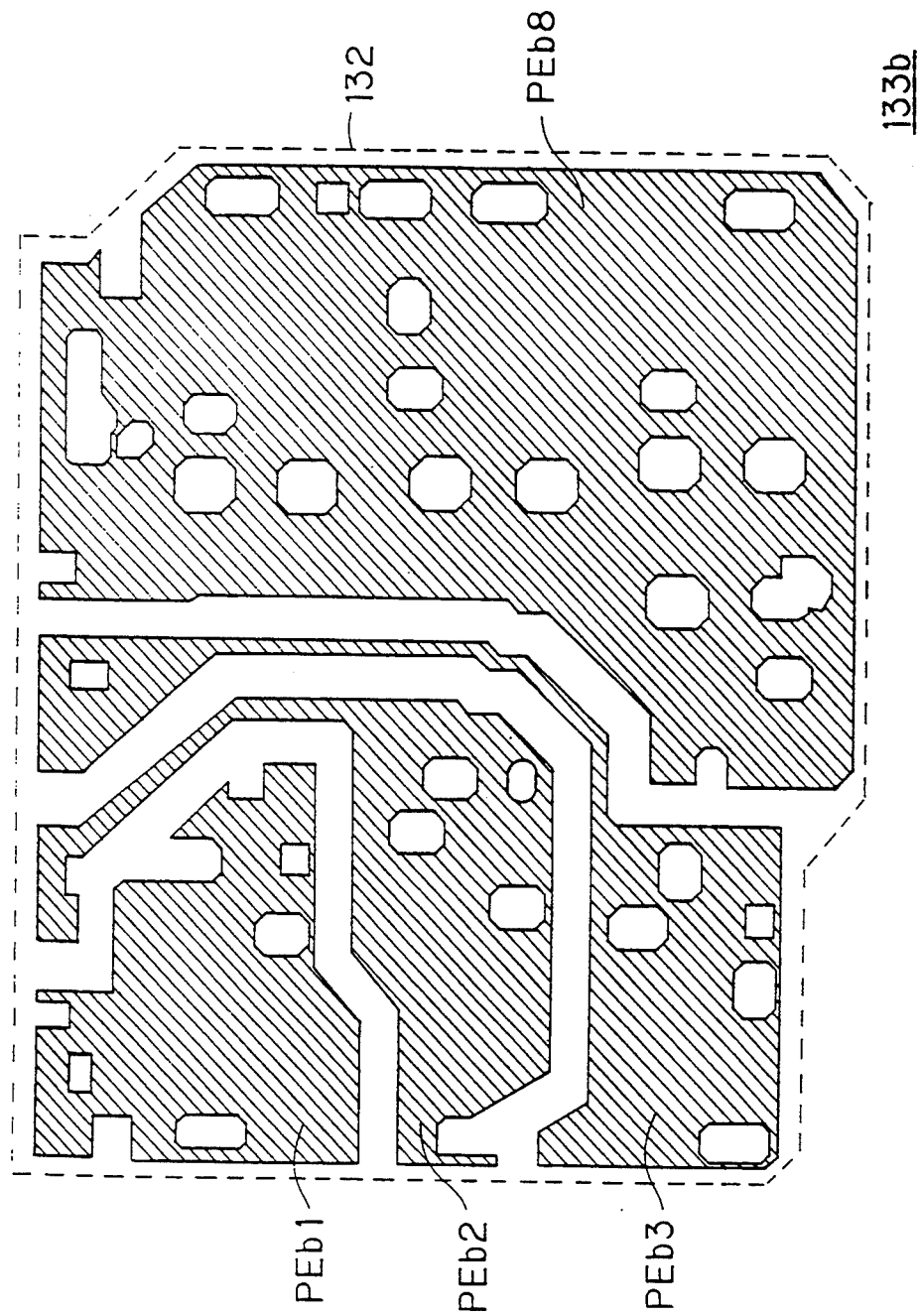
FIG. 10 is a plan view of a second wiring pattern layer in the circuit board of the control circuit according to the preferred embodiment of the present invention.

As shown in FIG. 10, the second wiring pattern layer 133b substantially overlaps the sub-patterns of the wiring pattern 133a belonging to the areas A1–A3 and A8.

That is, the second wiring pattern layer 133b consists of wiring sub-patterns PEb1-PEb3 and PEb8 substantially overlapping the sub-patterns of the wiring pattern 133a located in the areas A1-A3 and A8, respectively. The sub-patterns PEa1-PEa4 in FIG. 1 extend along respective contours of the sub-patterns PEb1-PEb3. The sub-patterns PEb1-PEb3 and PEb8 are connected to the negative power potentials of the circuits belonging to the areas A1-A3 and AS, respectively, to thereby shield the circuits in the areas A1-A3 and A8 from electric noises from the main circuit 120 and the like.

Figure 11:
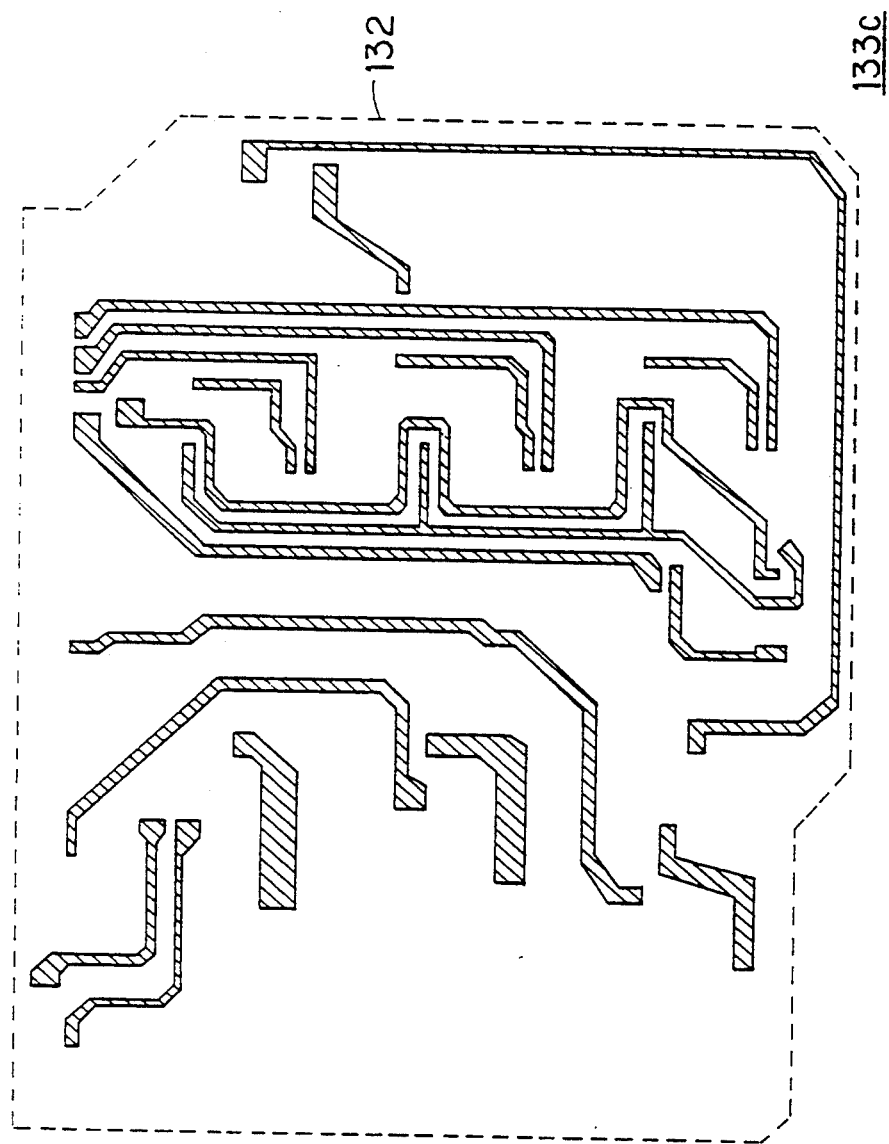
FIG. 11 is a plan view of a third wiring pattern layer in the circuit board of the control circuit according to the preferred embodiment of the present invention.

Respective parts in the third wiring pattern layer 133c shown in FIG. 11 are connected to the signal input terminals IN1-IN6 and the through holes TH(S1)-TH(S6), respectively, to thereby transmit the detector signals from the through holes TH(S1)-TH(S6) and the input signals VIN1-VIN6. All of these signals are input signals to the semiconductor elements IC1-IC6, which are transmitted by respective parts of the third wiring pattern layer 133c.

Figure 12:
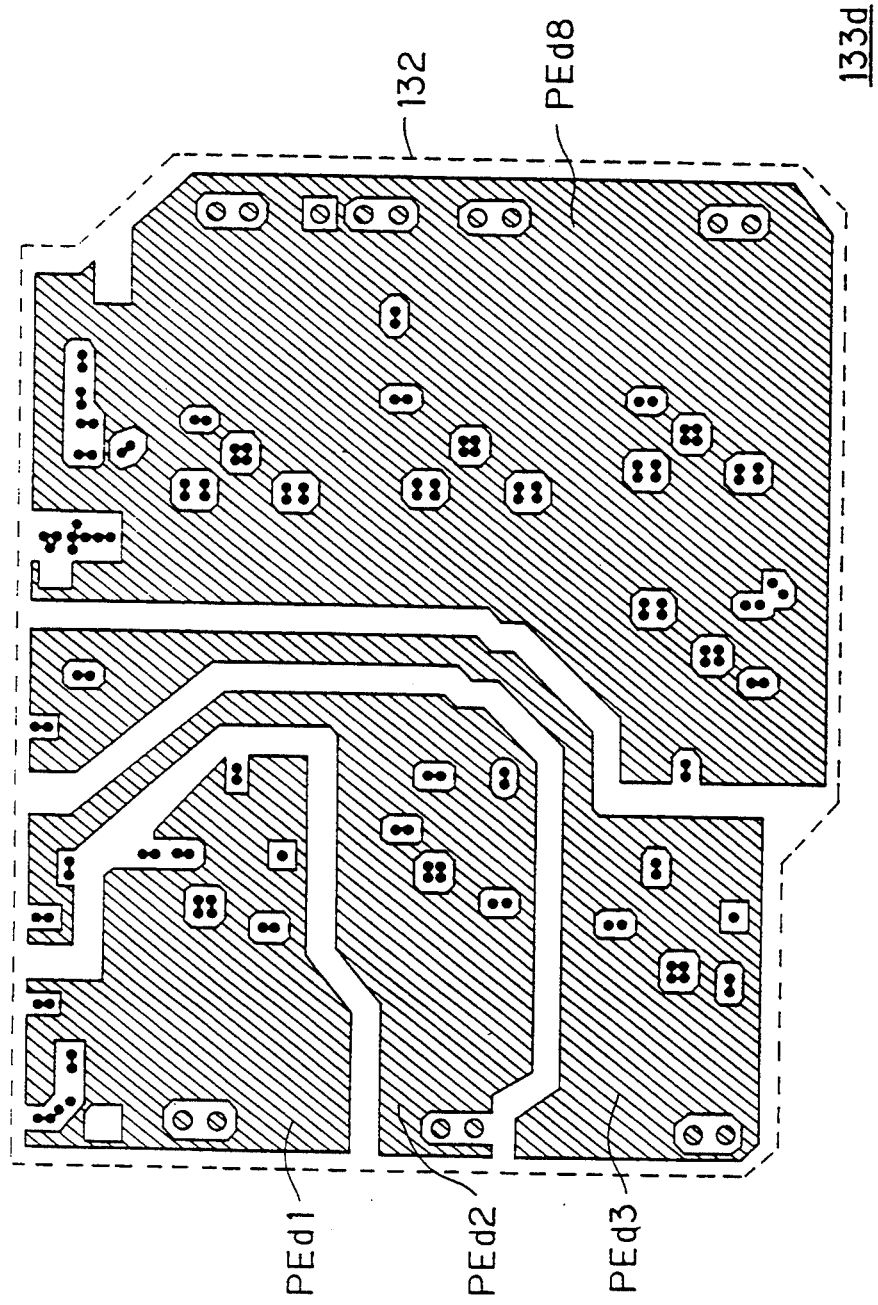
FIG. 12 is a plan view of a fourth wiring pattern layer in the circuit board of the control circuit according to the preferred embodiment of the present invention.

The fourth wiring pattern layer 133d shown in FIG. 12 is arranged similarly to the second wiring pattern layer 133b. That is, the fourth wiring pattern layer consists of the wiring sub-patterns PEd1-PEd3 and PEd8 substantially overlapping the sub-patterns of the wiring pattern 133a in the areas A1-A3 and A8, respectively. The wiring sub-patterns PEd1-PEd3 and PEd8 are connected to the negative power potentials of the circuits belonging to the areas A1-A3 and A8. Accordingly, similarly to the second wiring pattern layer 133b, the fourth wiring pattern layer 133d shields the circuits in the areas A1-A3 and A8 from electric noises generated in the main circuit 120 and the like to thereby enhance the shielding effect of the second wiring pattern layer 133b. Since the wiring patterns 133d and 133b of the stable potentials cover the top and bottom sides of the third wiring pattern layer 133c, the third wiring pattern layer 133c is effectively shielded by the electric noises. As a result, electric noises hardly reach the wiring pattern layer 133c for transmitting the input signals to the semiconductor elements IC1-IC6, to whereby prevent misoperation of the semiconductor elements IC1-IC6 due to electric noises.

The wiring patterns for transmitting the input signals to the semiconductor elements IC1-IC6 are inclined to receive electric noises since the wiring patterns are so designed as to decrease the impedance between the wiring patterns and the stable potentials such as a power potential. If the electric noises are received by the wiring patterns, they are mixed with the input signals to the semiconductor elements IC1-IC6 to cause misoperation of the semiconductor elements IC1-IC6. On the other hand, the main circuit 120 located near to the semiconductor elements IC1-IC6 repeatedly open and close large currents at a high frequency. Thus, the main circuit 120 is a source of generating electric strong noises. Accordingly, it is required to give noise-shielding function to the wiring patterns for transmitting the input signals to the semiconductor elements IC1-IC6. The arrangement of the wiring pattern layers 133a-133d in the present module provides the noise-shielding function to the circuit board 131.

Now back to FIG. 1, the wiring patterns:

P(VEE1)-P(VEE3), P(VCC1)-P(VCC3) and
P(IN1)-P(IN3)

connected to the terminal 104 are arranged such that the wiring pattern P(INi) for i=1−3 is between the wiring patterns P(VEEi) and P(VCCi). FIG. 13(a) illustrates the section of the circuit board 131 around the wiring patterns P(IN1), P(VEE1) and P(VCC1) as an example. Since the wiring pattern P(IN1) is between the wiring pattern P(VEE1) and P(VCC1), sufficient shielding of the pattern P(IN1) only requires the part of the wiring pattern layer 133b to just overlap the bottoms of the patterns P(IN1), P(VEE1) and P(VCC1). That is, the lateral width of respective parts of the second wiring pattern layer 133b may be substantially the same as the lateral width of corresponding parts of the first wiring pattern layer 133a.

On the other hand, the wiring pattern P(IN1) may be provided out of the patterns P(VEE1) and P(VCC1) as shown in FIG. 13(b) in the form of a sectional view. In this case, however, the wiring pattern 133b for preventing electric noises from penetrating into the wiring pattern P(IN1) should be arranged so as to cover not only the wiring pattern P(IN1) but also the peripheral wide region X. Thus, the arrangement in FIG. 13(a) is superior to the arrangement in FIG. 13(b) fin that the wiring pattern 133 requires less area and the circuit board 131 becomes compact. The size of the module 100 becomes small correspondingly.

<Wiring Patterns of Circuit Board 121c>

Figure 14:
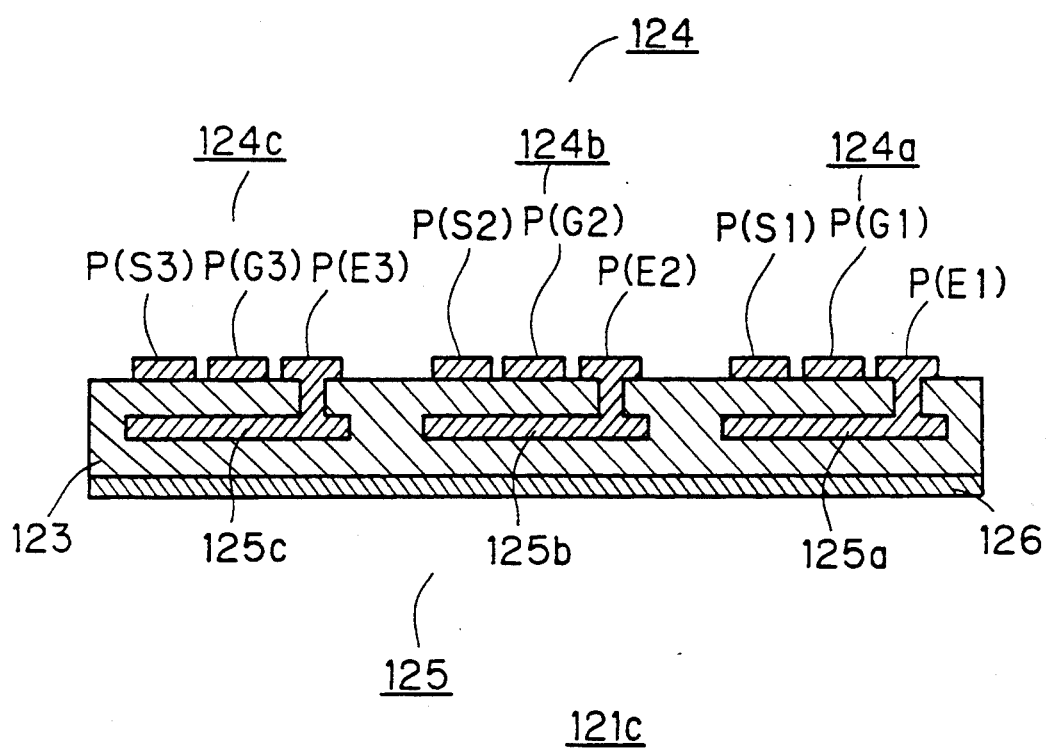
FIG. 14 is a sectional view of the circuit board of the main circuit according to the preferred embodiment of the present invention.
Figure 15A:
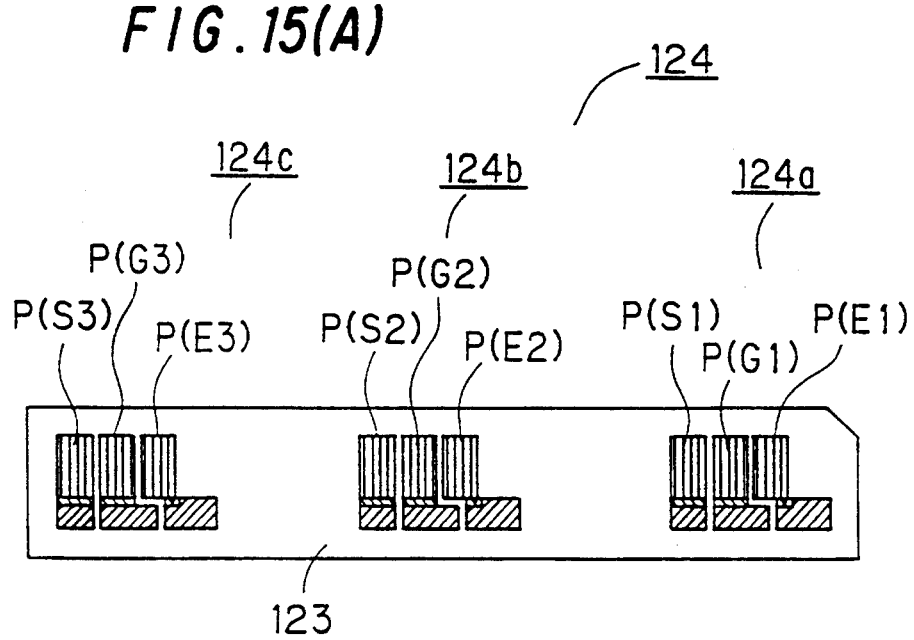
FIGS. 15(a)-15(c) are plan views of a wiring pattern on the circuit board of the main circuit according to the preferred embodiment of the present invention.
Figure 15B:
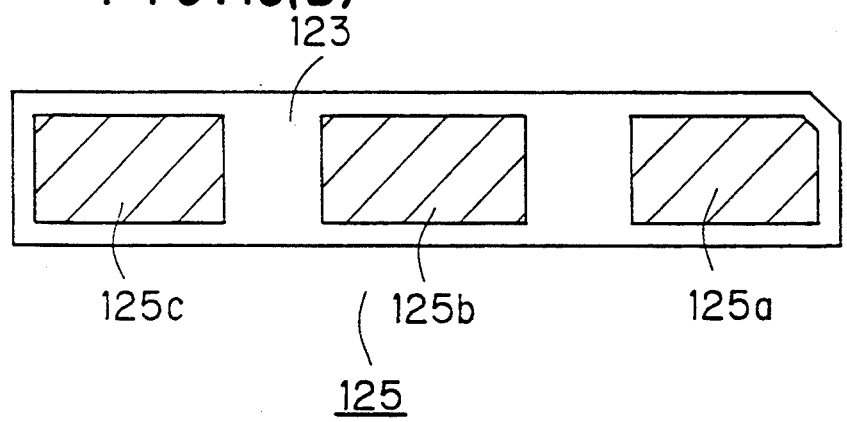
Figure 15C:
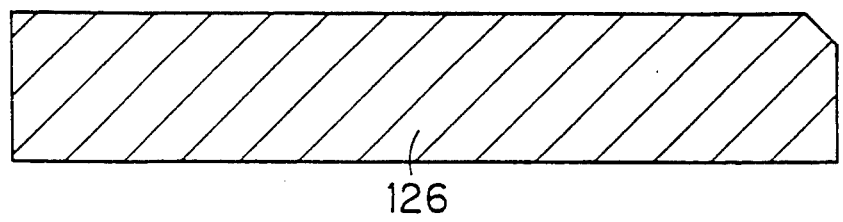

FIG. 14 is a sectional view showing the circuit board 121c. The circuit board 121c has three-layered conductive patterns. FIGS. 15(a)-15(c) illustrate plan views of the three-layered conductive patterns.

The first layer has wiring patterns 124a-124c formed on the top surface of the circuit board body plate 123, which are connected to the IGBT elements T1-T3. The second layer has wiring patterns 125a-125c overlapping to the corresponding ones of the first layer 124a-124c. The wiring patterns 125a-125c are connected to the wiring patterns P(E1)-P(E3), respectively. The wiring patterns 125a-125c are at the, same potentials as the emitters of the IGBT elements T1-T3, respectively. Accordingly, the wiring patterns 125a-125c suppress penetration of noises into the wiring patterns P(S1)-P(S3) and P(G1)-P(G3), which are the path of the signals for controlling the semiconductor elements IC1-IC3 and IGBT elements T1-T3. Consequently, misoperation of the semiconductor elements IC1-IC3 and IGBT elements T1-T3 due to electric noises is effectively prevented.

The third wiring pattern layer 126 provided on the whole areas of the bottom surface of the circuit board body plate 126 is soldered to the top surface of the copper base 122, as described before.

<Wiring Patterns of Circuit Board 121d>

Figure 16A:
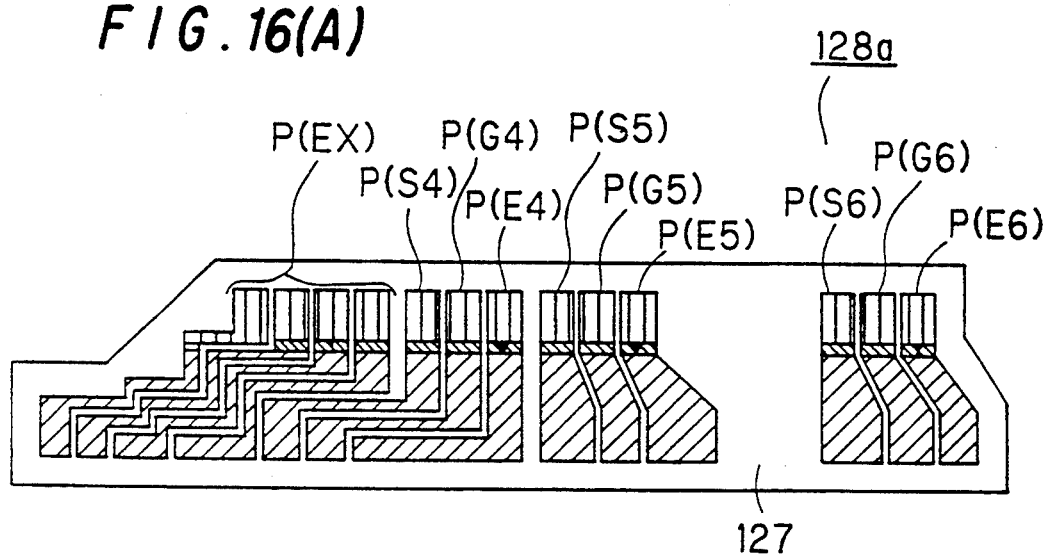
FIGS. 16(a)-16(c) are plan views of a wiring pattern on the circuit board of the main circuit according to the preferred embodiment of the present invention.
Figure 16B:
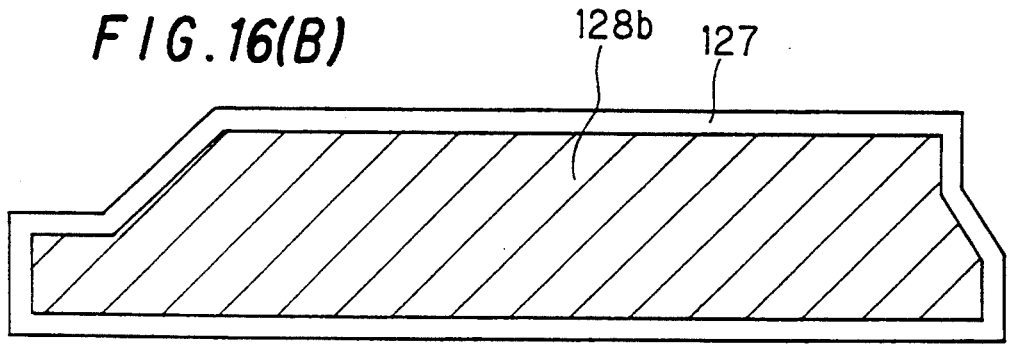
Figure 16C:
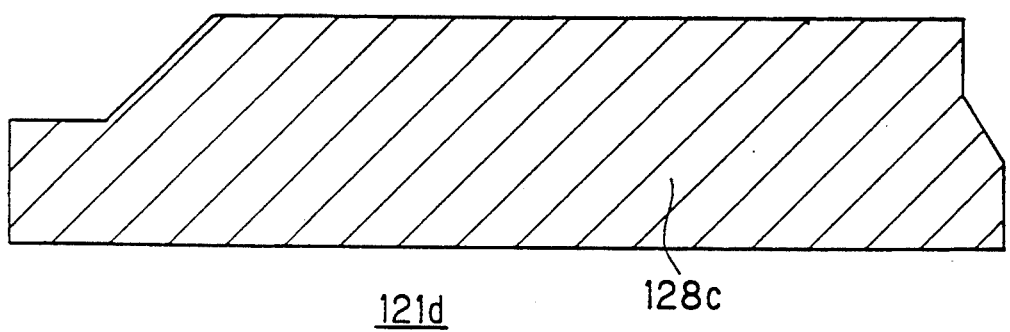

The circuit board 121d also has three-layered conductive patterns as in the circuit board 121c. FIGS. 16(a)-16(c) are plan views of the three-layered wiring patterns used in the circuit board 121d. The first wiring layer 128a is formed on the top surface of a body plate 127. The second wiring layer 128b is provided under the first wiring layer 128a to fully cover all of the first wiring layer 128a. The wiring pattern 128b is connected to the wiring pattern P(E5), for example, and the electric potential thereof is equal to the lower potential N which is the common emitter potential of the IGBT elements T4-T6. Accordingly, the wiring pattern 128b shields from electric noises the wiring patterns P(S4)-P(S6) and P(G4)-P(G6) which are the path of signals for controlling the semiconductor elements IC-4-IC6 and the IGBT elements T4-T6. Further, the wiring pattern P(EX) including the path of the input signal to semiconductor element IC7 is shielded from the electric noises. As a result, misoperation of semiconductor elements IC4–IC7 and the IGBT elements T4–T6 due to electric noises is effectively prevented. The third wiring pattern layer 128c, which is formed on the whole area of the bottom surface of the body plate 127, is soldered to the top surface of the copper base 122, as in the circuit board 121c.

<<2. Second Preferred Embodiment>>

Figure 17:
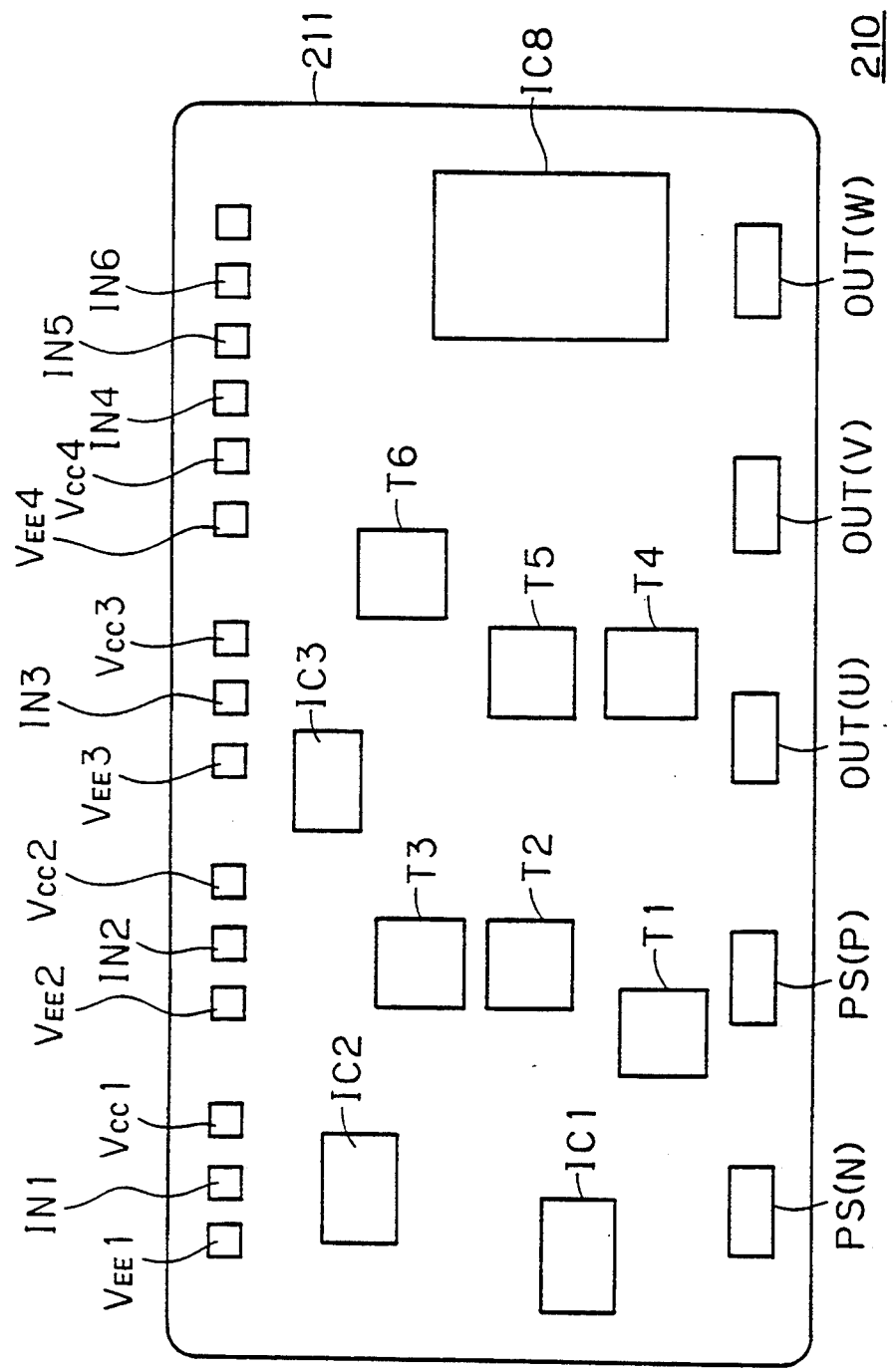
FIG. 17 is a plan view of a circuit board according to the second preferred embodiment of the present invention.

FIG. 17 is a diagram showing an arrangement of components on a circuit board 210 used in a semiconductor power module 200 according to a second preferred embodiment of the present invention. In FIG. 17 and the following drawings depicting the second preferred embodiment, the elements having the same functions as the module 100 are provided with the same reference numerals and symbols as in the module 100. The module 200 is used for controlling lower power than in the module 100 in the first preferred embodiment, and the rated output voltage and the maximum output current are at 220 V and below 30 A, respectively, for example. Thus, the main circuit 120 and the control circuit 130 are arranged on a same circuit board 210. A semiconductor element IC8 in FIG. 17 serves as the set of the semiconductor elements IC4–IC6 in the first preferred embodiment. In the arrangement in FIG. 17, illustration of respective passive elements associated with the semiconductor elements IC1–IC3 and IC8 are omitted, for convenience of illustration.

Figure 18:
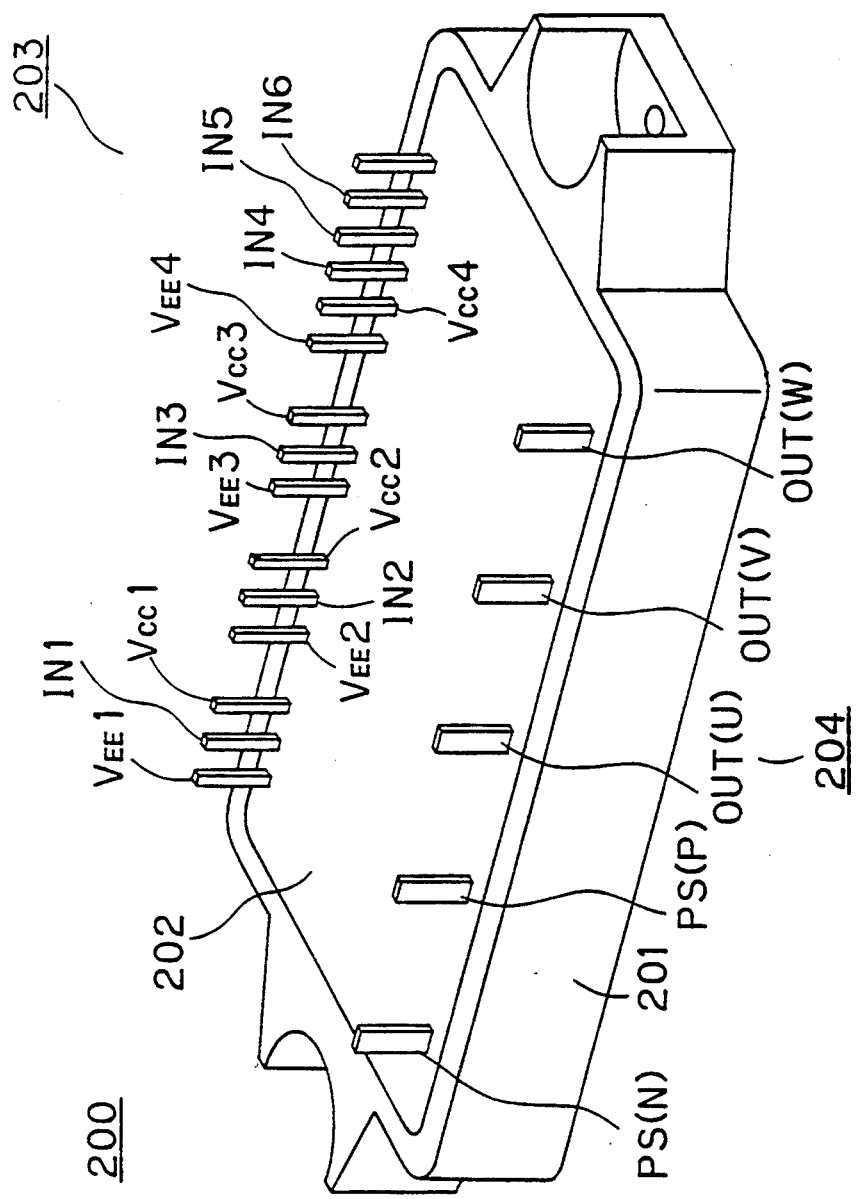
FIG. 18 is a perspective outside view of a module according to the second preferred embodiment of the present invention.

FIG. 18 shows a perspective outside view of the module 200. The circuit board 210 is contained in a housing 201 made of an insulator such as a synthetic resin. The top of the module 200 is provided with a cover 202 also made of an insulator. Terminals 203 for the control circuit and terminals 204 for the main circuit are exposed out of the cover 202. A heat radiative plate made of aluminum (not shown) is provided on the bottom of the module 200.

Figure 19:
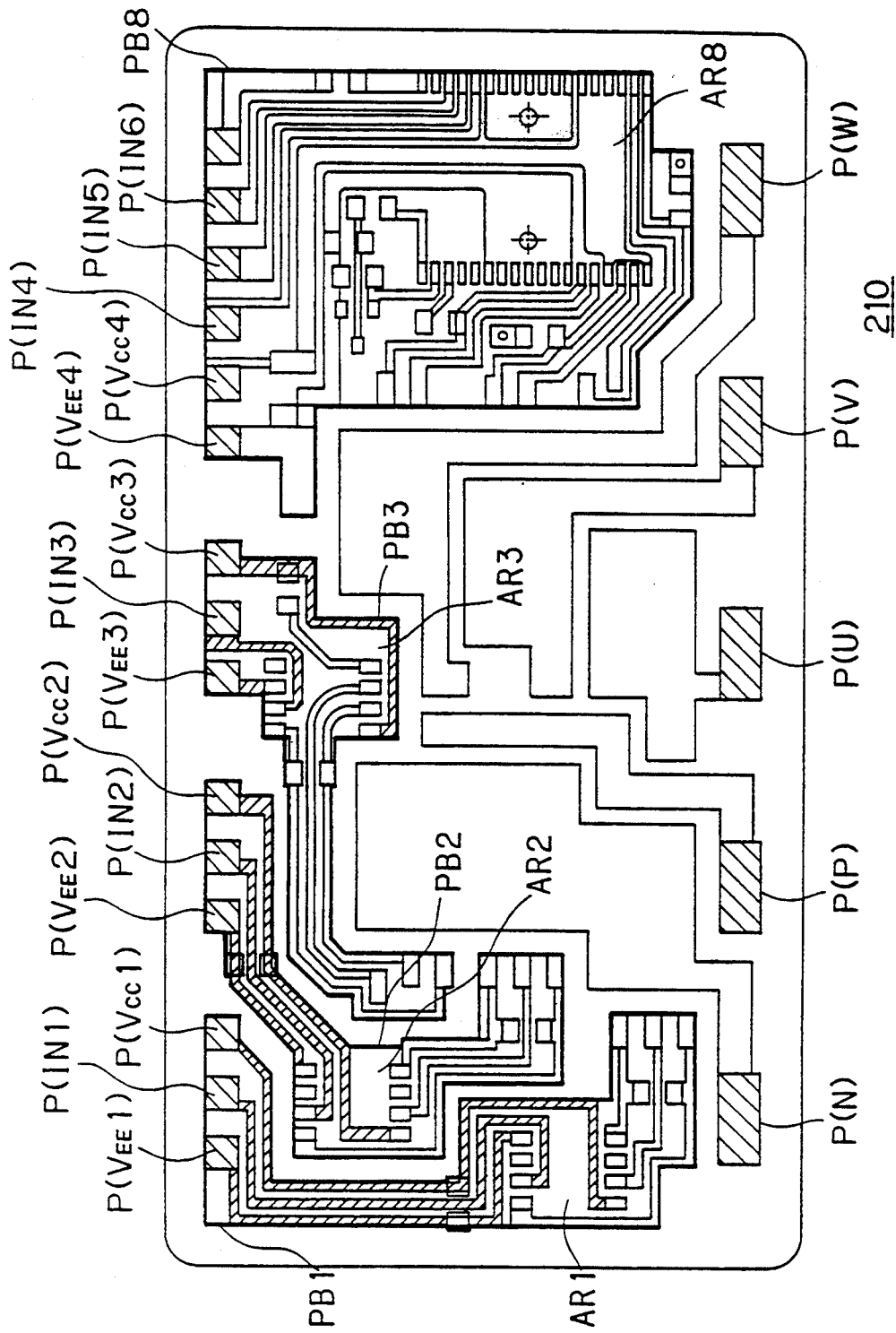
FIG. 19 is a plan view of the circuit board according to the second preferred embodiment of the present invention.

FIG. 19 is a plan view showing wiring patterns in the circuit board 210. The circuit board 210 is a double-sided substrate (two-layered substrate) which has wiring patterns on the top and bottom surfaces of a substrate body plate 211. In FIG. 19, respective wiring patterns on both layers are depicted as overlapped. The wiring patterns shown by narrow lines correspond to those on the top surface of the circuit board 210 (i.e, the first-layer wiring patterns), while the wiring patterns shown by wide lines correspond to those on the bottom surface of the circuit board 210 (i.e, the second-layer wiring patterns). IGBT elements T1–T6 and the other circuit elements are mounted on the top surface.

The semiconductor elements IC1–IC3 and IC8, the circuit elements associated therewith and the first-layer wiring patterns are arranged in minimum areas AR-1–AR3 and AR8, respectively. The second-layer wiring patterns PB1–PB3 and PB8 are so provided as to cover the spaces just under the areas AR1–AR3 and AR8, respectively. The second-layer wiring patterns PB1–PB3 and PB8 are connected to the wiring sub-patterns P(VEE1)–P(VEE3) and P(VEE4), respectively. Accordingly, the wiring pattern PB1–PB3 hold the same potential as the emitter potentials of the IGBT elements T1–T3, while the wiring pattern PB8 holds the same potential as the common emitter potential of the IGBT elements T4–T6. The wiring patterns PB1–PB3 and PB8 suppress penetration of noises into circuits belonging to the areas AR1–AR3 and AR8, respectively.

The wiring sub-patterns P(VEE1)–P(VEE3), P(VCC1)–P(VCC3) and P(IN1)–P(IN3) are arranged such that the sub-pattern P(INi) is between the sub-patterns P(VEEi) and P(VCCi) for i=1, 2 and 3. In FIG. 19, these wiring sub-patterns are shown by hatching with narrow lines.

Figure 20A:
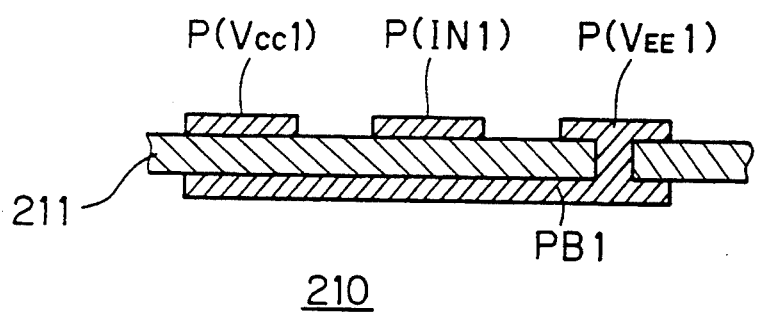
FIGS. 20(a) and 20(b) are sectional views of the circuit board according to the second preferred embodiment of the present invention.
Figure 20B:
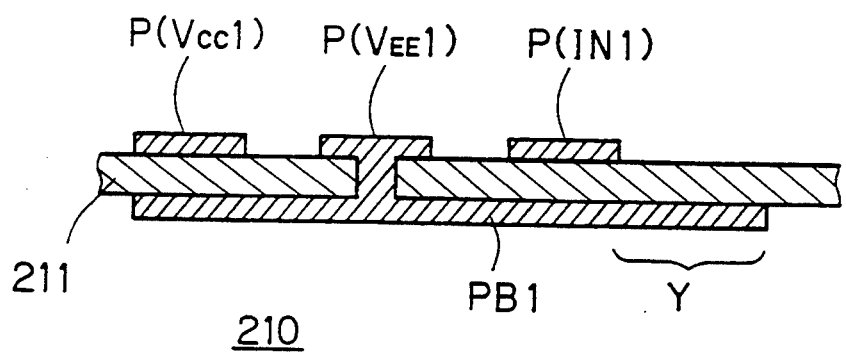

FIG. 20(a) illustrates a section of the circuit board 210 around the position of the sub-patterns P(IN1), P(VEE1) and P(VCC1), for example. Since the sub-pattern P(IN1) is between the sub-patterns P(VEE1) and P(VCC1), sufficient prevention of penetrating electric noises into the wiring sub-pattern P(IN1) requires only that the pattern PB1 covers the space just under the sub-patterns P(VEE1), P(VCC1) and P(IN1). On the other hand, the sub-pattern P(IN1) may be provided out of the sub-patterns P(VEE1) and P(VCC1), as shown in FIG. 20(b). However, in the case of FIG. 20(b), the sub-pattern PB1 should cover not only the space just under the sub-pattern P(IN1) but also the peripheral areas surrounding the sub-pattern P(IN1).

Thus, as compared with the case of FIG. 20(b), the arrangement in the case of FIG. 20(a) requires small area on which wiring sub-patterns are to be provided, and the size of the circuit board 210 can be decreased to make the module 200 more compact. The module 200 is advantageous in that the main circuit 120 and the control circuit 130 are arranged on the single board 211 and the size of the module 200 becomes small as the area size of the control circuit 130 is decreased, as compared with the module 100 having respective circuit boards on which the main circuit 120 and the control circuit 130 are arranged. The construction of the module 200 in which the sub-pattern P(INi) is between the sub-patterns P(VEEi) and P(VCCi) is more effective for making the module more compact than the module 100.

While the invention has been shown and described in detail, the foregoing description is in all aspects illustrative and not restrictive. It is therefore understood that numerous modifications and variations can be devised without departing from the scope of the invention.

We claim:

1. A semiconductor power module comprising:
   a control semiconductor element for controlling a power control semiconductor element;
   a circuit board including first to third wiring patterns, said first wiring pattern being connected to a control electrode of said control semiconductor element, said second and said third wiring patterns being respectively connected to a high-level and a low-level power source terminal of said power control semiconductor element, said second and said third wiring patterns being formed in a same plane as said first wiring pattern in such a manner that said second and said third wiring patterns are on both sides of said first wiring pattern; and
   a conductive layer which is formed on said circuit board in such a manner that said conductive layer faces and covers said first wiring pattern through an insulating layer of said circuit board, said conductive layer being connected to a potential applied to one of said second and said third wiring patterns.

2. A semiconductor power module comprising:
   a power control semiconductor element including a main current detection terminal;

a control semiconductor element for controlling said power control semiconductor element;

a circuit board including first to third wiring patterns, said first wiring pattern being connected to a control electrode of said control semiconductor element, said second wiring pattern being connected to said main current detection terminal and said control semiconductor element, said third wiring pattern being connected to a low-level power source terminal of said power control semiconductor element, said first and said second wiring patterns being formed in a same plane as said third wiring pattern in such a manner that said first and said second wiring patterns are adjacent to said third wiring pattern; and a conductive layer which is formed on said circuit board in such a manner that said conductive layer faces and covers said first and said second wiring patterns through an insulating layer of said circuit board, said conductive layer being connected to the same potential as said third wiring pattern.

3. A semiconductor power module comprising:

control semiconductor elements which are disposed in correspondence with a plurality of power control semiconductor elements, each one of said control semiconductor elements controlling a corresponding one of said power control semiconductor elements;

a circuit board, first wiring patterns being formed adjacent to each other in one major surface of said circuit board, said first a wiring patterns being respectively located in a plurality of regions in each of which at least one of said control semiconductor elements is formed; and second wiring patterns formed in said one major surface of said circuit board in such a manner that each one of said second wiring patterns surrounds a corresponding one of said first wiring patterns in each one of said plurality of said regions, said second wiring patterns being connected to a potential of high-level power source terminals or low-level power source terminals of said control semiconductor elements.

4. The semiconductor power module of claim 3, wherein said second wiring patterns each surround a third wiring pattern which is connected at least to a control electrode of a corresponding one of said control semiconductor elements.

5. A semiconductor power module comprising:

a main circuit board with a plurality of power control semiconductor elements disposed on a first major surface thereof;

a control circuit board having second and third major surfaces which face each other, said second major surface of said control circuit board facing said first major surface of said main circuit board;

a plurality of first wiring patterns formed adjacent to each other on said third major surface of said control circuit board, a plurality of control semiconductor elements being formed in said first wiring patterns in such a manner that at least one of said plurality of said control semiconductor elements is disposed in each one of said first wiring patterns, said control semiconductor elements controlling said power control semiconductor elements and being commonly connected to high-level and low-level power source terminals;

a plurality of first shield patterns formed of a conductive material and disposed in an insulating layer of said control circuit board so as to face and substantially overlap each one of said first wiring patterns through said insulating layer, said first shield patterns being connected to a potential of said high-level or said low-level power source terminals of said control semiconductor elements;

a plurality of second shield patterns formed of a conductive material and disposed on said second major surface of said control circuit board so as to approximately correspond to said first shield patterns, said second shield patterns each being connected to said potential of said high-level or said low-level power source terminals of said control semiconductor elements; and a plurality of third; shield patterns formed in portions of said insulating layer of said control circuit board connected to input terminals of said control semiconductor elements, through said insulating layer and said input terminals being respectively formed in said first wiring patterns, said portions facing said first and said second shield patterns.

6. A semiconductor power module comprising:

a main circuit board with a plurality of power control semiconductor elements disposed on a first major surface thereof;

a control circuit board having second and third major surfaces which face each other, said second major surface of said control circuit board facing said first major surface of said main circuit board;

a plurality of first wiring patterns formed adjacent to each other on said third major surface of said control circuit board, a plurality of control semiconductor elements being formed on said first wiring patterns in such a manner that at least one of said plurality of said control semiconductor elements is disposed in each of said first wiring patterns, said control semiconductor elements controlling said power control semiconductor elements and being commonly connected to high-level and low-level power source terminals, said power control semiconductor elements and said control semiconductor elements approximately overlapping each other;

a plurality of first shield patterns formed of a conductive material and disposed in an insulating layer of said control circuit board so as to face and substantially overlap each one of said first wiring patterns through said insulating layer, said first shield patterns being connected to a potential of said high-level or said low-level power source terminals of said control semiconductor elements;

a plurality of second shield patterns formed of a conductive material and disposed on said second major surface of said control circuit board so as to approximately correspond to said first shield patterns, said second shield patterns being each connected to said potential of said high-level or said low-level power source terminals of said control semiconductor elements; and a plurality of third shield patterns formed in portions of said insulating layer of said control circuit board and connected to input terminals of said control semiconductor elements, through said insulating layer and said input terminals being respectively formed in said first wiring patterns, and said portions facing said first and said second shield patterns.

7. A semiconductor power module comprising:
a first circuit board having respective output terminals of a plurality of phases, pairs of power semiconductor elements being disposed on said first circuit board respectively for said plurality of said phases;
a second circuit board on which control semiconductor elements are disposed independently of each other in regions which are common to high-level and low-level power source terminals of said control semiconductor elements, each one of said control semiconductor elements controlling a corresponding one of said power semiconductor elements;
a container case in which said first and said second circuit boards are placed in a predetermined order from a bottom of said container case;
a lid made of an insulating material and disposed to engage with an upper end of said container case so as to face said second circuit board; and
a shield plate disposed on a surface of said lid and being divided into divided portions insulated from each other, said divided portions of said shield plate facing and approximately overlapping said regions and being respectively connected to a potential of said high-level or said low-level power source terminals of said control semiconductor elements.

* * * * *